US012693318B2

(12) United States Patent
Dummermuth et al.

(10) Patent No.: US 12,693,318 B2
(45) Date of Patent: Jul. 28, 2026

(54) SELF-CALIBRATING RADIO FREQUENCY CALORIMETER

(71) Applicant: Bird Technologies Group Inc., Solon, OH (US)

(72) Inventors: Martin Dummermuth, Chagrin Falls, OH (US); Timothy Holt, Chardon, OH (US); Jeffrey Klis, Chardon, OH (US); Bill Clemson, Solon, OH (US); Adam Cordingley, Solon, OH (US)

(73) Assignee: Bird Technologies Group Inc., Solon, OH (US)

( * ) Notice: Subject to any disclaimer, the term of this patent is extended or adjusted under 35 U.S.C. 154(b) by 0 days.

(21) Appl. No.: 18/929,599

(22) Filed: Oct. 28, 2024

(65) Prior Publication Data

US 2025/0138065 A1 May 1, 2025

Related U.S. Application Data

(60) Provisional application No. 63/546,179, filed on Oct. 27, 2023, provisional application No. 63/545,936, filed on Oct. 26, 2023.

(51) Int. Cl.
*G01R 21/02* (2006.01)

(52) U.S. Cl.
CPC .................................... *G01R 21/02* (2013.01)

(58) Field of Classification Search
CPC .... G01R 21/02; G01R 21/00; G01R 19/0007; G01R 22/04; G01R 35/00; G01R 29/0878; G01K 17/00; G01K 17/006; G01K 17/08; G01K 17/003; G01K 17/04; H05B 6/6467
See application file for complete search history.

(56) References Cited

U.S. PATENT DOCUMENTS 4,531,843 A * 7/1985 Kuhnlein ............... G01K 17/12
374/E17.01
5,156,459 A * 10/1992 Baker .................. G01K 17/003
374/E17.002
(Continued)

FOREIGN PATENT DOCUMENTS

KR 10-2005-0017572 A 2/2005
WO WO/2023/150399 A1 8/2023

OTHER PUBLICATIONS

Patent Cooperation Treaty (PCT), International Search Report and Written Opinion for Application PCT/US2024/053302 filed Oct. 28, 2024, mailed Feb. 14, 2025, International Searching Authority, KR.

*Primary Examiner* — Vinh P Nguyen
(74) *Attorney, Agent, or Firm* — McDonald Hopkins LLC

(57) ABSTRACT

Disclosed is a radio frequency (RF) calorimeter having National Metrology Institute (NMI) traceable measurement accuracy with uncertainty of less than about ±0.25%, including the incorporation of a low-frequency reference source integral to the calorimeter for the purpose of self-calibration, a load with very high thermal efficiency, a temperature-controlled load enclosure, a vacuum relay high-power RF switch, an integrated low-frequency reference source, a non-reactive coolant liquid, a liquid-to-liquid heat exchanger, a self-calibration routine that can be performed on demand, and machine learning algorithms to create more accurate data models.

36 Claims, 24 Drawing Sheets

(56)                    References Cited

U.S. PATENT DOCUMENTS

| | | | |
|---|---|---|---|
| 5,186,540 A * | 2/1993 | Walsh | G01R 21/02 |
| | | | 374/E17.008 |
| 7,049,805 B2 * | 5/2006 | Rose | G01R 22/04 |
| | | | 324/95 |
| 9,921,251 B2 * | 3/2018 | Meltzer | G01R 21/02 |
| 10,168,365 B2 * | 1/2019 | Meltzer | G01R 21/02 |
| 10,228,295 B2 * | 3/2019 | Villate | G01K 19/00 |
| 2005/0174101 A1 | 8/2005 | Rose et al. | |
| 2014/0239940 A1 * | 8/2014 | Meltzer | G01R 21/02 |
| | | | 324/95 |
| 2015/0192480 A1 | 7/2015 | Villate et al. | |

* cited by examiner

PRIOR ART

125

101

| AC | Parameter | Nominal | Expanded Unc | Distribution | Divisor | Standard Unc |
|---|---|---|---|---|---|---|
| Yokogawa | Basic Accuracy | 1700 | 0.016 | Rectangular | 2√3 | 0.005 |
| Yokogawa | Accuracy 6 Months | 1700 | 0.063 | Normal (k=2) | 2 | 0.031 |
| | Combined | | 0.064 % | Normal | 2 | 0.032 |

| DC | Parameter | Nominal | Expanded Unc | Distribution | Divisor | Standard Unc |
|---|---|---|---|---|---|---|
| DMM | Load Voltage Accuracy | 291.5 | 0.000058 | Normal | 2 | 0.000029 |
| DMM | Load Voltage Spec 1 Year | 291.5 | 0.0061 | Normal | 2 | 0.0030 |
| DMM | Shunt Voltage Accuracy | 0.6 | 0.000058 | Normal | 2 | 0.000029 |
| DMM | Shunt Voltage Spec 1 Year | 0.6 | 0.0042 | Normal | 2 | 0.0021 |
| Shunt | Shunt Resistance | 0.1 | 0.0018 | Normal | 2 | 0.00090 |
| Shunt | Shunt Resistance Drift | 0.0 | 0.025 | Rectangular | 1.73 | 0.014 |
| | Combined | | 0.030 % | Normal | 2 | 0.015 |

Figure 23

SELF-CALIBRATING RADIO FREQUENCY CALORIMETER

CROSS-REFERENCE TO RELATED APPLICATION

This application claims priority to and incorporates by reference in its entirety both, U.S. Prov. App. 63/545,936, filed on Oct. 26, 2023, and titled RADIO FREQUENCY CALORIMETER, and U.S. Prov. App. 63/546,179, filed on Oct. 27, 2023, and titled RADIO FREQUENCY CALORIMETER.

FIELD OF THE INVENTION

This application is directed to radio frequency (RF) power measurement. More specifically, to an RF power measurement using a calorimeter.

BACKGROUND OF THE INVENTION

The RF calorimeter has long been considered the most accurate method for the measurement of RF power. The National Institute of Standards (NIST) and other National Metrology Institutes (NMI's) around the world maintain transfer references for a standard watt of RF power in the form of various calorimeters for different frequency bands. RF calorimeters are historically very challenging instruments to use, requiring very careful measurements of temperature, flow, and coolant properties. The substitutionary approach of using low-frequency reference sources, such as 60 Hz, has improved upon the uncertainty of these calorimeters, but only to around ±0.4%, due to the vast number of error sources that are present.

BRIEF SUMMARY OF THE INVENTION

According to an exemplary embodiment of the present invention, a radio frequency (RF) calorimeter is provided having a total uncertainty of less than about ±0.25%.

According to an exemplary embodiment of the present invention, an RF calorimeter is provided. The RF power calorimeter having a load electrically coupled to a single-pole, double-throw RF switch, the RF switch configured to electrically connect the load to either an RF power source having an unknown value or a known low-frequency reference power source (low-frequency reference power source having a known value); the known low-frequency reference power source may be a variable low-frequency reference power source, electrically coupled to the load via the RF switch, and configured to apply low-frequency power to the load; a coolant thermally coupled to the load; an inlet temperature sensor thermally coupled to the coolant, the inlet temperature sensor being positioned to measure the temperature of the coolant without any heating by the load; an outlet temperature sensor thermally coupled to the coolant, the outlet temperature sensor being positioned to measure the temperature of the coolant due to heating by the load; circuitry configured to calculate power of the RF source electrically coupled to the RF input by: determining an average power of the RF source based on the difference in temperature of the inlet and outlet temperature sensor measurements of the coolant, while being heated by either the known reference power source or the unknown RF power source.

In an exemplary embodiment of the invention, the RF calorimeter has an electronically controlled RF switch that allows for the selection of either the known low-frequency reference source or the unknown RF source.

In an exemplary embodiment of the invention, the RF switch is comprised of a vacuum relay to handle high power.

In an exemplary embodiment of the invention, the RF calorimeter has an integrated reference source. The RF calorimeter is capable of calibrating itself to the known reference source on demand, such that the calibration occurs near real time to the unknown power measurement.

In an exemplary embodiment of the invention, the RF calorimeter uses a load with very high thermal efficiency such that all of the power that is electrically applied to the load is transferred to the coolant with near-zero loss to other areas.

In an exemplary embodiment of the invention, the RF calorimeter uses a temperature-controlled enclosure for the load to prevent varying ambient temperature from affecting the temperature of the load and the coolant flowing therein.

In an exemplary embodiment of the invention, the low-frequency reference source is an alternating current (AC) voltage source.

In an exemplary embodiment of the invention, the reference source is a direct current (DC) voltage source.

In an exemplary embodiment of the invention, the fluid is water or a mixture of water and other materials.

In an exemplary embodiment of the invention, the fluid is silicone oil or another type of non-reactive fluid.

In an exemplary embodiment of the invention, the fluid is cooled by means of a heat exchanger through which the fluid flows.

In an exemplary embodiment of the invention, the heat exchanger is a chiller that can actively cool below room temperature.

In an exemplary embodiment of the invention, the fluid is cooled by means of a liquid-to-liquid heat exchanger, such that there is a primary cooling circuit and a secondary cooling circuit.

In an exemplary embodiment of the invention, the fluid in the primary cooling circuit is silicone oil or another type of non-reactive fluid and the fluid in the secondary cooling circuit is water or a mixture of water and other materials.

In an exemplary embodiment of the invention, the flow-rate of the fluid through the RF calorimeter is variable.

In an exemplary embodiment of the invention, the RF calorimeter is configured to measure power at frequencies between about 0 Hz and about 200 MHz.

In an exemplary embodiment of the invention, the RF calorimeter is configured to measure power between about 100 W and about 3000 W.

In an exemplary embodiment of the invention, the RF calorimeter is configured to measure power at frequencies between about 0 Hz and about 3000 MHz.

In an exemplary embodiment of the invention, the RF calorimeter is configured to measure power between about 1 W and about 200 W.

According to an exemplary embodiment of the invention, a method of measuring RF power comprises using temperature measurements of a coolant in thermal contact with an RF load in combination with a DC reference power to measure unknown RF power.

According an exemplary embodiment of the invention, a method of measuring RF power is provided. The method of measuring RF power includes: providing a load electrically coupled to an RF input; providing a coolant thermally coupled to the load; controlling the RF switch to direct the known reference source to the load, the known reference source having a predetermined range of power values;

measuring the difference in temperature of the coolant at the input and output of the load during the application of reference power; creating a model of the difference in temperature compared to the applied power, the model including a correction to account for any power loss in the RF switch; controlling the RF switch to direct the unknown RF input to the load; measuring the difference in temperature of the coolant at the input and output of the load during the application of unknown RF power; applying the model of the difference in temperature compared to the applied power to calculate the power of the unknown RF source.

Advantages of the present invention will become more apparent to those skilled in the art from the following description of the embodiments of the invention which have been shown and described by way of illustration. As will be realized, the invention is capable of other and different embodiments, and its details are capable of modification in various respects.

BRIEF DESCRIPTION OF SEVERAL VIEWS OF THE DRAWINGS

These and other features of the present invention, and their advantages, are illustrated specifically in embodiments of the invention now to be described, by way of example, with reference to the accompanying diagrammatic drawings, in which:

FIG. 23 shows the uncertainty contribution of a DC reference source in comparison to an AC reference source of a calorimeter in accordance with an exemplary embodiment of the invention.

Figure 1:
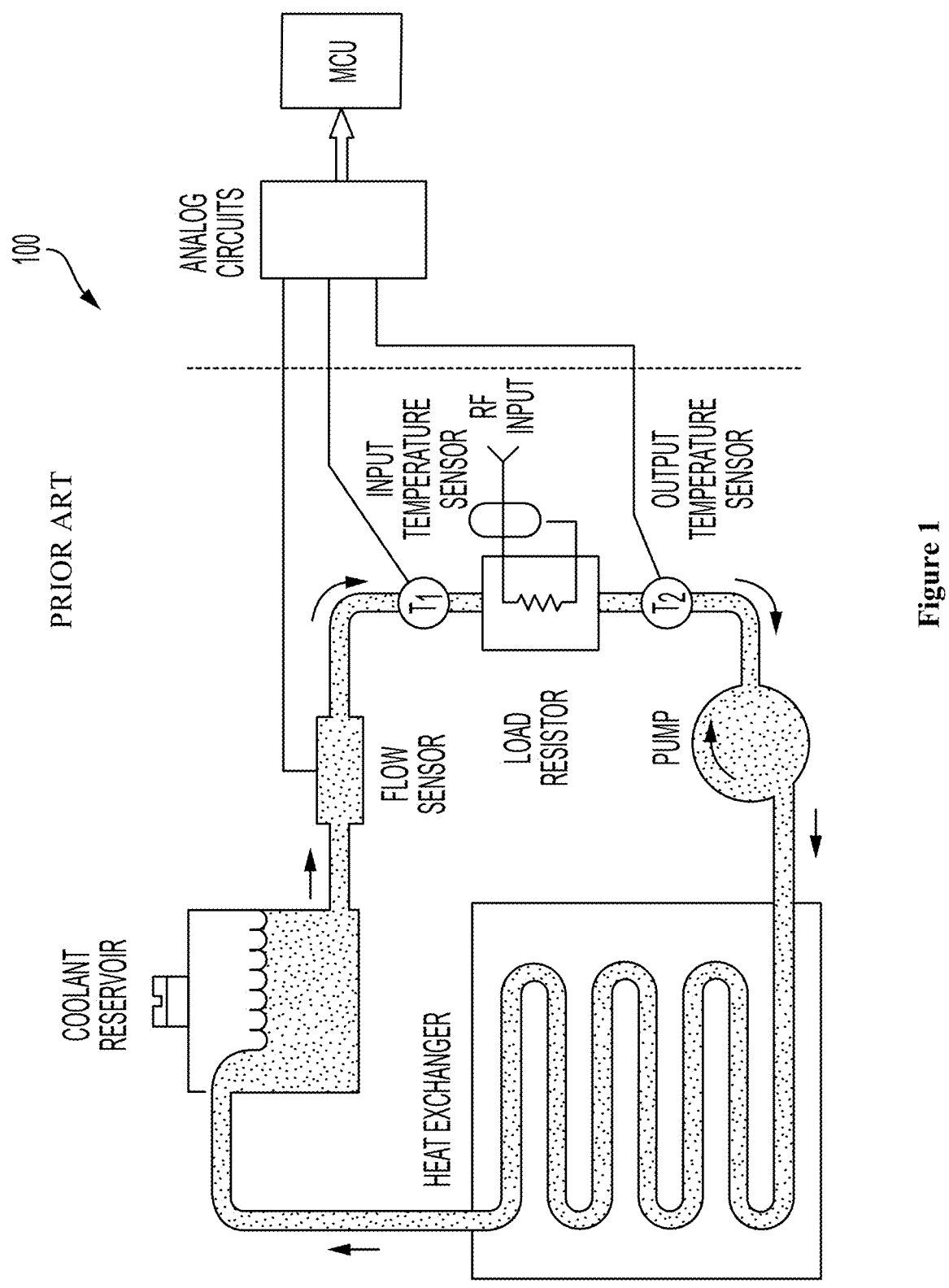
FIG. 1 shows the system-level block diagram of a conventional absolute flow calorimeter.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawing(s) and description are to be regarded as illustrative in nature and not as restrictive.

DETAILED DESCRIPTION OF THE PREFERRED EMBODIMENT

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In at least some instances, the approximating language may correspond to the precision of an instrument for measuring the value. Range limitations may be combined and/or interchanged, and such ranges are identified and include all the sub-ranges stated herein unless context or language indicates otherwise. Other than in the operating examples or where otherwise indicated, all numbers or expressions referring to quantities of ingredients, reaction conditions and the like, used in the specification and the claims, are to be understood as modified in all instances by the term "about".

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

As used herein, the terms "comprises", "comprising", "includes", "including", "has", "having", or any other variation thereof, are intended to cover a non-exclusive inclusion. For example, a process, method, article or apparatus that comprises a list of elements is not necessarily limited to only those elements, but may include other elements not expressly listed or inherent to such process, method, article, or apparatus.

The singular forms "a", "an", and "the" include plural referents unless the context clearly dictates otherwise.

A "processor", as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures, including, but not limited to, a microcontroller containing both a processor and memory, programmable logic array (PLA), application specific integrated circuit (ASIC), or any type of device suitable for processing signals, performing general computing, and/or arithmetic functions. The processor can include various modules to execute various functions.

A "memory", as used herein can include volatile memory and/or nonvolatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDRSDRAM), and direct RAM bus RAM (DR-RAM). The memory can also include a disk. The memory can store an operating system that controls or allocates resources of a computing device. The memory can also store data for use by the processor.

A "controller", as used herein, can include a processor and memory in the same package, or the processor and memory in various configurations comprising multiple packages, including the processor and memory being located in separate packages.

A "module", as used herein, includes, but is not limited to, hardware, firmware, software in execution on a machine, and/or combinations of each to perform a function(s) or an action(s), and/or to cause a function or action from another module, method, and/or system. A module can include a software controlled microprocessor, a discrete logic circuit, an analog circuit, a digital circuit, a programmed logic device, a memory device containing executing instructions, and so on.

A "disk", as used herein can be, for example, a magnetic disk drive, a solid state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system and/or program that controls or allocates resources of a computing device.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical non-transitory signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments described herein include process steps and instructions described herein in the form of an algorithm. It should be noted that the process steps and instructions of the embodiments could be embodied in software, firmware or hardware, and when embodied in software, could be downloaded to reside on and be operated from different platforms used by a variety of operating systems. The embodiments can also be in a computer program product which can be executed on a computing system.

The embodiments also relates to an apparatus for performing the operations herein. This apparatus can be specially constructed for the purposes, e.g., a specific computer, or it can comprise a general-purpose computer selectively activated or reconfigured by a computer program stored in the computer. Such a computer program can be stored in a non-transitory computer readable storage medium, such as, but is not limited to, any type of disk including floppy disks, optical disks, CD-ROMs, magnetic-optical disks, read-only memories (ROMs), random access memories (RAMs), EPROMS, EEPROMs, magnetic or optical cards, ASICs, or any type of media suitable for storing electronic instructions, and each electrically connected to a computer system bus. Furthermore, the computers referred to in the specification can include a single processor or can be architectures employing multiple processor designs for increased computing capability.

The algorithms and displays presented herein are not inherently related to any particular computer or other apparatus. Various general-purpose systems can also be used with programs in accordance with the teachings herein, or it can prove convenient to construct more specialized apparatus to perform the method steps. The structure for a variety of these systems will appear from the description below. In addition, the embodiments are not described with reference to any particular programming language. It will be appreciated that a variety of programming languages can be used to implement the teachings of the embodiments as described herein, and any references below to specific languages are provided for disclosure of enablement and best mode of the embodiments.

In addition, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments, which is set forth in the claims. A system-level block diagram of a conventional radio frequency (RF) absolute flow calorimeter 100 is shown in FIG. 1. In calorimeter 100, radio frequency (RF) power is passed to a load 105, such as an internal load resistor. The load may be 105 is hollow and has the working coolant 145, such as a fluid, flow through it. A pump 110 is used to circulate the fluid from the reservoir 120 to the load 105 and then back to the reservoir 120 after removing the heat by passing it through a heat exchanger 125. The pump 110 may be variable speed, such that the flowrate of the coolant 145 through the cooling circuit 195 may be variable. In an exemplary embodiment, the speed of the pump 110 may be dictated (controlled) by the controller 130, thereby controlling the flowrate of the coolant 145 through the cooling circuit 195. The reservoir 120 is large enough to stabilize the working coolant and keep the average temperature of the coolant constant. Temperature sensors, such as an inlet temperature sensor 135 and an outlet temperature sensor 140, are used to measure the temperature difference between the coolant 145 before passing through the load 105 and after. A flow sensor 150 is used to measure the mass flow rate of the coolant 145 through the load 105. By thermodynamic first principles, the RF power can be determined from the temperature difference, mass flow rate, and specific heat of the coolant 145. The output of the flow sensor 150, inlet temperature sensor 135, and outlet temperature sensor 140 are provided to a controller 130.

It has been discovered that to make an accurate measurement, temperature, mass flow rate, and specific heat must be accurately known. This is very challenging due to a number of factors, including calibration of the inlet temperature sensor 135 and/or outlet temperature sensor 140, drift of the inlet temperature sensor 135 and/or outlet temperature sensor 140, calibration of the flow sensor 150, resolution of the flow sensor 150, variation in properties of the coolant 145, degradation of the coolant 145, and changes in the ambient conditions in which the calorimeter 100 is located. The substitution method has been used to remove some of these error sources by calibrating the power measurement of the calorimeter to a known low-frequency reference power. The slow response time and lengthy settling time of the calorimeter results when using the substitution method calibration process typically taking several hours to complete. Consequently, calibrations to the low-frequency reference are typically only performed every few days or weeks. Infrequent calibration increases the overall uncertainty of the calorimeter power measurement by allowing drift and other changes to accumulate. All of these factors have prevented high-power flow calorimetry from improving measurement uncertainty to any better than around ±0.4%. Thus, a need exists to improve the measurement uncertainty to better than around ±0.4%.

FIGS. 2A-19 as described below are directed to an embodiment of a calorimeter 101 that has a National Metrology Institute (NMI) traceable measurement accuracy with a total uncertainty of less than about ±0.25%. This vast improvement in measurement uncertainty is demonstrated in FIGS. 20-22. In some exemplary embodiments, the calorimeter 101 may be configured to measure power between about 1 W to about 3,000 W, between about 100 W to about 3000 W, and/or between about 1 W to 200 W. Further, in some exemplary embodiments, the calorimeter 101 may be configured to measure power at frequencies between about 0 Hz to about 3000 MHz and/or between about 0 Hz to about 200 MHz.

FIG. 2A-5 show system-level block diagram of various embodiments of a calorimeter 101 having a low-frequency reference source 190 and chiller 160 in accordance with an exemplary embodiment of the calorimeter 101 as shown in FIGS. 6-19. In an exemplary embodiment, calorimeter 101 has a cooling circuit 195 for coolant 145. In an exemplary embodiment, the cooling circuit 195 can have a primary cooling circuit 196 and a secondary cooling circuit 197. The load 105 can be situated along the primary cooling circuit 196 and be thermally coupled to the coolant 145. The load 105 is highly efficient to minimize errors associated with heat loss through the load body and RF input 185. The RF input 185 may also sometimes be called an RF connector. The load 105 has an inlet 106 at the upstream end of the load 105 where the coolant 145 enters the load 105 and an outlet 107 at the downstream end of the load 105. The inlet temperature sensor 135 being located upstream from the load 105 by the inlet 106 and the outlet temperature sensor 140 being downstream from the load 105 at the outlet 107. The inlet temperature sensor 135 and outlet temperature sensor 140 are both thermally coupled to the coolant 145. In an exemplary embodiment, the inlet temperature sensor 135 and outlet temperature sensor 140 are positioned such that there is no heat transferred to them directly from the load 105. In another exemplary embodiment, the inlet temperature sensor 135 is positioned such that it measures the temperature of the coolant 145 at the inlet 106 of the load 105 without any heating of the inlet temperature sensor 135 by the load 105. In an exemplary embodiment, the inlet temperature sensor 135 is positioned to measure the temperature of the coolant 145 before the coolant enters and received heat from the load 105, and the outlet temperature sensor 140 is positioned to measure the temperature of the coolant 145 after the coolant 145 is heated by and passes through the load 105. The load 105 has an internal resistor 108 located inside the body 109. The internal resistor 108 being electrically connected to the RF input connector 185 and in thermal contact with the coolant 145. The RF input connector 185 may have a center conductor 187 and an outer conductor 188. The RF calorimeter 101 optionally has a silver plated quartz tube 189 providing mechanical and electrical connection between the RF input 185 and the load 105. The reservoir 120 can be located downstream from the outlet temperature sensor 140 and the pump 110 can be located downstream from the reservoir 120. The heat exchanger 125 can be located downstream from the pump 110 and a mixing tank 165 can be located downstream from the heat exchanger. The flow sensor 150 can be located downstream from the mixing tank and upstream from the inlet temperature sensor 135. The flow sensor 150 is used to measure the mass flow rate of the coolant 145 through the load 105, a flow path pressure sensor 151 is used to measure the pressure of the coolant 145 in the cooling circuit 195, the load enclosure temperature sensor 153 is used to measure the temperature inside the temperature-controlled enclosure 175, which is located inside of the main enclosure 200, a main enclosure temperature sensor 152 is used to measure the temperature inside the main enclosure 200.

The calorimeter 101 has circuitry 103 including, but not limited to, the controller 130, model, and various sensors described above and below, to calculate the power of the power source 104. In an exemplary embodiment, the circuitry 103 can determine (calculate) an average power of the power source 104 applied to and electrically coupled to the load 105 based on the temperature difference between the inlet temperature sensor 135 measurement of the coolant 145 and outlet temperature sensor 145 measurement of the coolant 145, while the load 105 is being heated by the application of power by the power source 104. The power source 104 can be either the low-frequency reference source 190 (having a known power value) or the RF power source 186 (having an unknown power value).

The heat exchanger 125 can have a primary side 126, which is connected to the primary cooling circuit 196 and is in flow communication with the coolant 145 flowing through the primary cooling circuit 196. The heat exchanger 125 can also have a secondary side 127, which is connected to the secondary cooling circuit 197 and is in flow communication with the coolant 145 flowing through the secondary cooling circuit 197. The heat exchanger 125 is thermally coupled to the coolant 145 and facilitates the transfer of thermal energy (heat) between the coolant 145 in the primary cooling circuit 196 and the coolant 145 in the secondary cooling circuit 197. It is contemplated that the coolant 145 in the primary cooling circuit 196, also known as the primary flowpath coolant 146, can be of the same type as the coolant 145 in the secondary cooling circuit 197, also known as the secondary flowpath coolant 147.

In an embodiment, the secondary side 127 of the heat exchanger may be connected to a chiller 160, such that the chiller 160 is in thermal communication with the coolant 145 in the secondary cooling circuit 197 to facilitate the removal of thermal energy (heat) from the coolant 145 in the secondary cooling circuit 197. The chiller 160 may connect to the cooling circuit 195 using the chiller inlet 161 and chiller outlet 162 on the rear panel 201 of the main enclosure 200 of the calorimeter 101.

The controller 130 receives inputs in the form of measurements from the inlet temperature sensor 135, outlet temperature sensor 140, reservoir 120, flow sensor 150, and user interface 170. The controller 130 sends outputs to the pump 110 to control the flow of the coolant 145 in the primary cooling circuit 196 of cooling circuit 195, and user interface 170. The user interface 170 can include an input device 171 to receive inputs from a user, an output device 172 to provide information to the user, and/or a combination of the two, such as, but not limited to, a touch screen. The user interface 170 can also be a web-interface or application that is accessible, such as, but not limited to, via the Ethernet port 220 or through SCPI commands via an application programming interface (API). In some exemplary embodiments, the input device 171 can be, but is not limited to, a keypad and/or push buttons. Further, in some exemplary embodiments, the output device 172 can be, but is not limited to, an LCD display 173 and/or LEDs. In other embodiments, it is complicated that user interface 170, input device 171, and output device 172 can be any devices and/or interface deemed suitable by a person having ordinary skill in the art. The controller 130 can receive information through the input device 171, such as, but not limited to, a reset command from the reset button 174 and/or emergency stop command from the emergency stop button 176. The controller 130 can also sends outputs to LCD display 173 in the form of information, such as, but not limited to, the status of the calorimeter 101, values for the various measurements received by the controller 130, and the RF power measurements calculated by the controller 130.

Figure 2A:
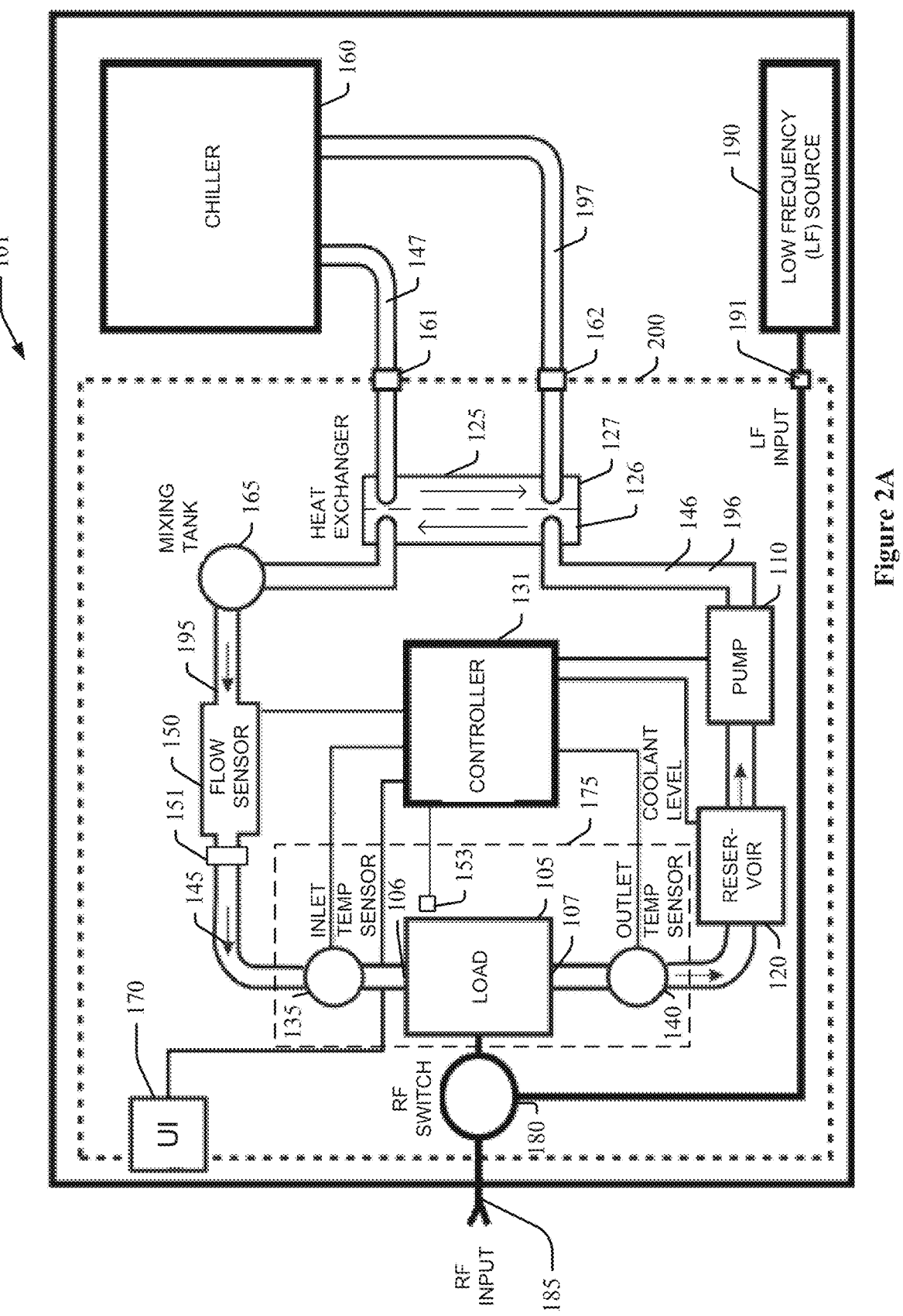
FIG. 2A shows the system-level block diagram of a flow calorimeter with external DC reference source and chiller in accordance with an exemplary embodiment of the invention.
Figure 2B:
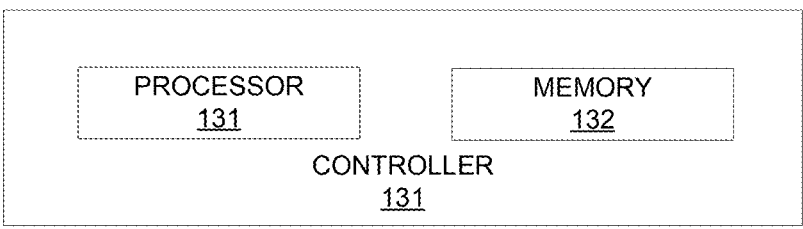
FIG. 2B shows a block diagram of the controller of the calorimeter of FIG. 2A in accordance with an exemplary embodiment of the invention.
Figure 2C:
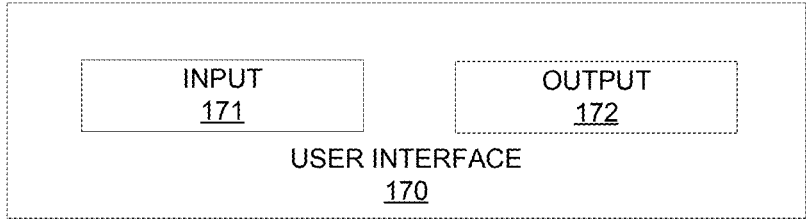
FIG. 2C shows a block diagram of the user interface of the calorimeter of FIG. 2A in accordance with an exemplary embodiment of the invention.
Figure 2D:
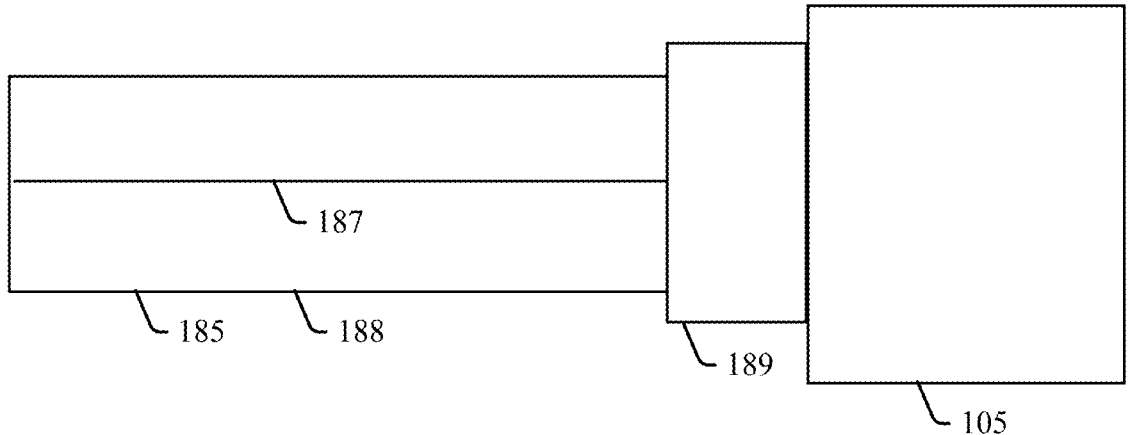
FIG. 2D shows a block diagram of the RF input, load, and optional quartz tube of the calorimeter of FIG. 2A in accordance with an exemplary embodiment of the invention.
Figure 3:
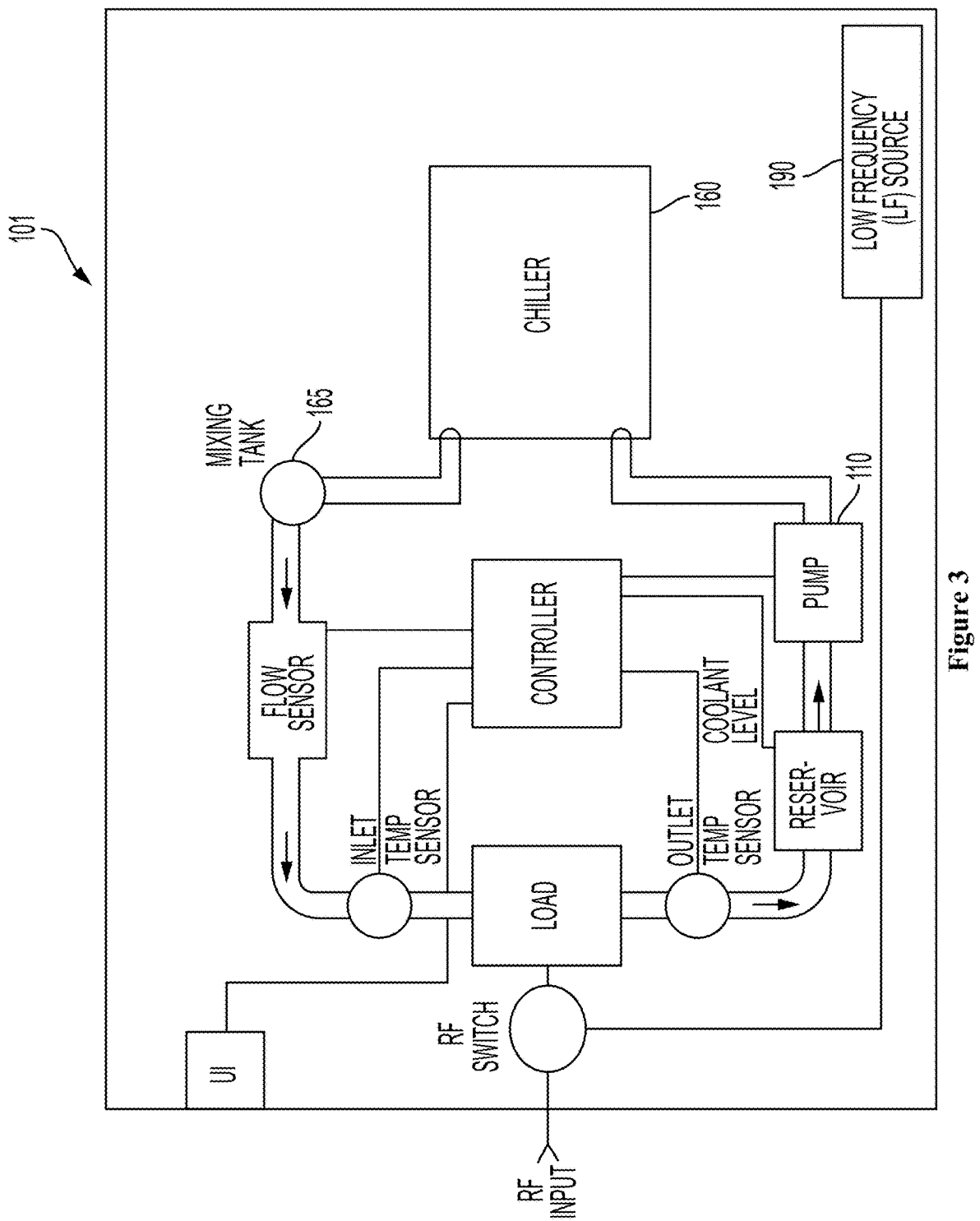
FIG. 3 shows the system-level block diagram of a calorimeter with internal DC reference source and chiller in accordance with an exemplary embodiment of the invention.
Figure 4:
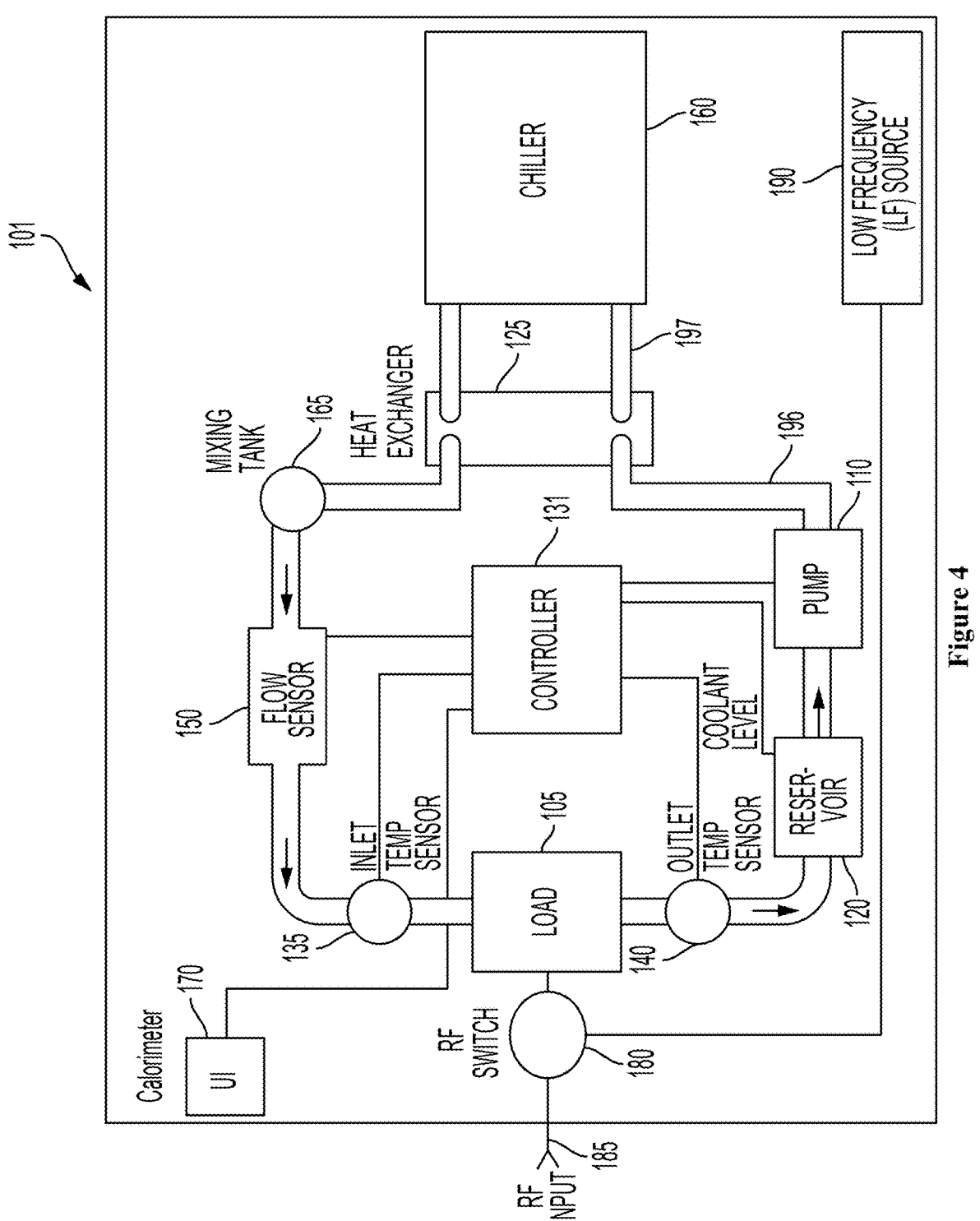
FIG. 4 shows the system-level block diagram of a calorimeter with internal DC reference source and solid-state chiller in accordance with an exemplary embodiment of the invention.

In an exemplary embodiment of the calorimeter 101, the chiller 160 and the low-frequency reference source 190 may be located outside the main enclosure 200 of calorimeter 101, as shown in FIG. 2A. In other exemplary embodiments, one or both of the chiller 160 and/or the low-frequency reference source 190 may be located inside main enclosure 200 of calorimeter 101 and integrated into the calorimeter 101, as shown in FIG. 3. In some exemplary embodiments of calorimeter 101, the integration of the low-frequency reference source 190 having known power value(s) permits and renders the calorimeter 101 capable of calibrating itself to the low-frequency reference source 190 on demand, such that the calibration of the calorimeter 101 may occur in near real time contemporaneously with a power measurement of an RF source 186 having unknown power value(s). Stated alternatively, in some embodiments of calorimeter 101, the calorimeter 101 may calibrate itself, using the low-frequency reference source 190, immediately before the calorimeter 101 measures the unknown power of the RF source 186.

In an exemplary embodiment of calorimeter 101, the load 105 is electrically coupled to and receives electrical power through the RF switch 180. The RF switch 180 can receive an input of power from a low-frequency source 190, such as through a low-frequency input 191 and apply the power to load 105. In an exemplary embodiment of calorimeter 101, low-frequency reference source 190 can be variable. Further, in some exemplary embodiments of calorimeter 101, low-frequency reference source 190 can be a DC reference standard. In other embodiments, the low-frequency reference source 190 can be an AC reference standard, such as any AC source that has a known power output value and frequency about less than or equal to about 60 Hz. The RF switch 180 can also receive an input from an RF source 186 through RF input 185. The RF switch 180 passes either the input received from the low-frequency reference source 190 or the RF source 186 to the load 105, depending upon the position of the RF switch 180. The RF switch 180 may receive a signal from the controller, which determines the position of the RF switch 180, thereby determining whether the power from the low-frequency reference source 190 is passed to the load 105 for calibration/training of the calorimeter 101, or the power from the RF source 186 is passed to the load 105 for the purpose of measuring the power of the RF source 186 using calorimeter 101. In an exemplary embodiment, RF switch 180 can be an electrically controlled vacuum switch (relay), such as a single pole, double throw switch that is capable of handling high power.

In some exemplary embodiments of calorimeter 101, RF switch 180 is designed for high power handling, low insertion loss, and low return loss over the frequency range of operation of the calorimeter 101. Further, in some exemplary embodiments of calorimeter 101, the RF switch is implemented using a vacuum relay and carefully impedance-matched to achieve the required performance of the calorimeter 101 over the frequency and power range of operation of the calorimeter 101. In an exemplary embodiment of the calorimeter 101, the frequency range may be from about DC (e.g. 0 HZ) up to about 3 GHz, and the power range may be from about 0-3,000 Watts.

In some exemplary embodiments of calorimeter 101, the low-frequency reference source 190 is incorporated into the calorimeter 101 as an integral part of the calorimeter 101. In some exemplary embodiments of calorimeter 101, the low-frequency reference source 190 can be contained within the main enclosure 200, and in other exemplary embodiments of calorimeter 101, the low-frequency reference source 190 is located outside of the main enclosure 200. In exemplary embodiments where the low-frequency reference source 190 is located outside of the main enclosure 200, the low-frequency reference source 190 may connect to the calorimeter 101 using the DC (low-frequency) input 191, which may be located on the rear panel 201 of the main enclosure. Similarly, the RF source 186 may be connected to the RF input 185, which may be mounted on the front panel 202 of the main enclosure 200.

Since the low-frequency reference source 190 is no longer used solely as a metrology aid to calibrate the system every few days or weeks, but is now permanently connected to the calorimeter 101 and used regularly to tie the RF measurement back to the low-frequency source 190. This effectively removes the uncertainty associated with drift by comparing the unknown RF measurement with the known low-frequency measurement in near real time. The electronically-controlled RF switch 180 shown in FIG. 2 is used to make the connection between the low-frequency reference source 190 and the load 105. This allows the calibration of calorimeter 101 to occur on demand. In an exemplary embodiment, the program running on controller 130 can determine when the calorimeter 101 needs calibrated (self-calibrates). In an exemplary embodiment of calorimeter 101, the controller 130 calibrates the calorimeter 101 using the low-frequency reference source. In an exemplary embodiment, the calorimeter 101 may calibrate itself to the low-frequency reference source 190 in near real time, to achieve a total uncertainty of less than about ±0.25% using substitution. In order to contribute insignificant amounts of error to the uncertainty budget of the calorimeter 101, the RF switch 180 must be extremely repeatable, reflectionless, low loss, and able to handle high power, such as up to about 2000 Watts. In some embodiments of RF switch 180, a vacuum relay is the switching element inside the RF switch 180, thereby creating a vacuum switch. High-frequency modeling of the RF switch 180 as a vacuum switch was used to design the enclosure for the switch, shown in FIG. 11, to achieve the exceptional return loss shown in FIG. 15. As can be seen, RF switch 180 achieves an insertion loss between about –0.0025 dB and about –0.0275 dB, and a return loss of between about –40 dB and about –68 db.

Another advantage of the exemplary embodiment is the use of an RF load with extremely high thermal efficiency, as disclosed by Holt et al. in WO/2023/150399 and Meltzer et al. in U.S. Pat. No. 9,992,251, both of which are herein incorporated by reference in their entireties. Historically, flow calorimeters have used water-cooled RF loads that were available on the market. These RF loads were designed for high power dissipation and good return loss over a wide frequency range. Little to no attention was given to ensuring that 100% of the applied power was dissipated into the coolant with zero power dissipation to the ambient environment. This is of no concern when the RF load 105 is used as a dummy load, but is significantly detrimental when the RF load 105 is used in a calorimeter. Any loss of heat into any medium other than the coolant 145 in cooing circuit 195 results in errors that increase the overall measurement uncertainty of the calorimeter 101. Common areas of thermal leakage include conduction from the RF load 105. More specifically, through the RF input connector 185 and radiation from the body of the RF load 105 to the ambient environment. These leakage paths are drastically reduced by careful attention to the design of the RF load 105, as disclosed by Meltzer et al. Such design considerations include, but are not limited to, using an electrically conductive, but thermally insulative, material to provide the connection between the RF input 185 and the load 105. In some embodiments of calorimeter 101, this connection can be a silver-plated fused quartz tube. The quartz tube provides the mechanical connection between the RF input 185 and the load 105, while maintaining high thermal isolation due to its low thermal conductivity of about 1.4 W/m·K. The silver plating provides the electrical connection between the RF input 185 and the load 105, due to its high electrical conductivity of about $6.3 \times 10^7$ S/m, but still maintains good thermal isolation, in spite of its high thermal conductivity of about 429 W/m·K, because the silver plating is only around 250 μm thick. Under these conditions, the heat transfer between the load 105 and the RF input 185 is less than about 0.3 Watts with 1700 Watts of applied power, contributing to less than ±0.018% of total system uncertainty.

Figure 9:
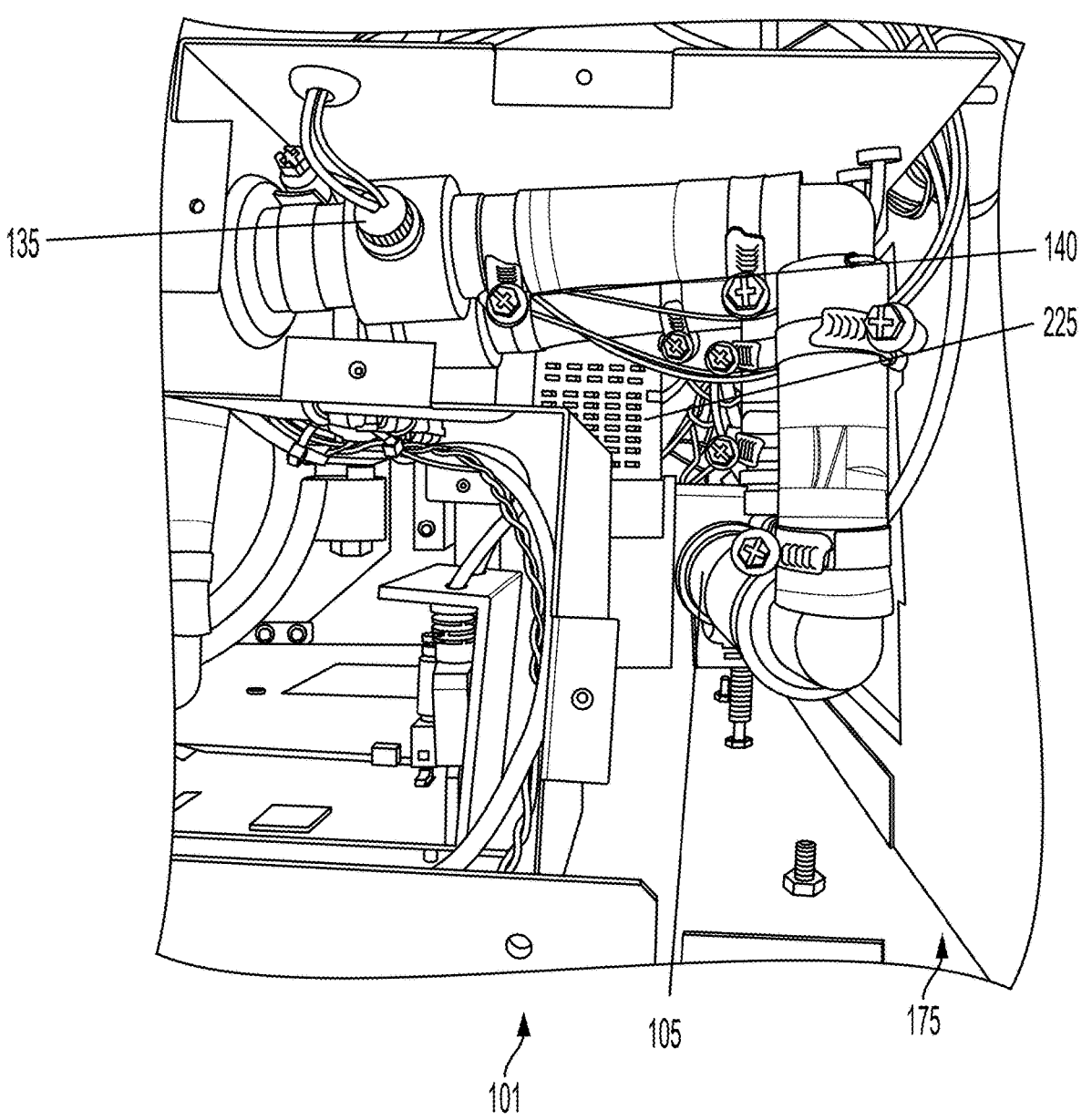
FIG. 9 shows a close up of the top view of embodiment calorimeter with cover off, focusing on the temperature-controlled enclosure where the RF load, inlet temperature sensor, and outlet temperature sensor are located in accordance with an exemplary embodiment of the invention.

To further isolate the load 105 from any remaining thermal leakage, in some embodiments of calorimeter 101, the load 105 may be placed in a temperature-controlled enclosure 175 shown in FIG. 9 that is located inside main enclosure 200 of calorimeter 101 to prevent ambient temperature from affecting the temperature of the load 105 and the coolant 145 flowing therein. This helps to ensure that the thermal gradient between the coolant 145 at the inlet 106 of the load 105 and the surrounding ambient environment is kept constant in order to minimize any error associated with said thermal gradient. In some embodiments, the surrounding ambient temperature is the temperature of the air located between the main enclosure 200 and of the temperature-controlled enclosure 175, stated alternatively, the air located within the main enclosure 200 and outside of the temperature controlled enclosure 175. Some embodiments of calorimeter 101 may also include a heater 225 in the temperature-controlled enclosure 175 with a closed-loop heater controller 226, shown in FIG. 12. The heater 225 may be used to maintain within the temperature-controlled enclosure 175 a constant temperature slightly above the ambient temperature within the main enclosure 200, such that the body of the load 105 is always held at a constant temperature. The load inlet temperature sensor 135 and outlet temperature sensor 140 are also included inside the temperature-controlled enclosure 175 to minimize any changes to their measurement accuracy due to changes in ambient temperature.

As was stated above, in some embodiments of calorimeter 101, the low-frequency reference source 190 may be a direct current (DC) reference source. It has been discovered that DC sources have the advantage of improved stability and accuracy over AC sources, as can be seen by the expanded uncertainty comparison of FIG. 21. Furthermore, DC sources are significantly easier to calibrate with traceability to NMI's, with many calibration labs having this capability in house. The primary reason that AC sources (particularly 60 Hz) have historically been used as the low-frequency reference in RF flow calorimeters is to avoid electro-chemical reactions that occur when water in the flowpath is exposed to DC. This problem may be avoided in calorimeter 101 by using silicone oil as the coolant 145 in contact with load 105. Silicone oil can come into direct contact with the high-voltage DC signal without the risk of any leakage currents, electrolysis, or electroplating that is possible when a different coolant 145, such as water, is used. In an exemplary embodiment, coolant 145 may be a silicone oil with viscosity of 1.5 cSt and specific heat of 0.410 cal/g° C. is used to achieve thermal properties as close as possible to water (1.0 cSt and 1.0 cal/g° C.), while avoiding the conductivity issues with water, especially water containing impurities such as dissolved solids. Careful consideration is given to the materials that are used in the flow path 195 of the calorimeter 100 to ensure that all materials that come in contact with the silicone oil coolant 145 are compatible with silicone oil.

Turning to FIG. 3, it can be seen that in some embodiments, the heat exchanger 125 may be directly replaced with a chiller 160, thereby obviating the need for the secondary cooling circuit 197 of cooling circuit 195 between the heat exchanger 125 and chiller 160. In these embodiments, the chiller 160 can be located between the pump 110 and mixing tank 165 on cooling circuit 195. The chiller 160 uses a refrigeration unit to actively cool the circulating coolant 145 on cooling circuit 195 such that the coolant can be maintained at a very constant temperature. The chiller 160 can actively cool the circulating coolant 145 below room (ambient) temperature. Generally, heat exchangers 125 use ambient air to transfer thermal energy. Thus, it is generally difficult for a heat exchanger 125 to provide the same temperature stability as a chiller 160 because a heat exchanger's ability to remove heat is generally directly related to the ambient temperature. Because commercially available chillers 160 are generally not compatible with silicone oil, some exemplary embodiments of calorimeter 101 uses the liquid-to-liquid heat exchanger 125 shown in FIGS. 5 & 14 to create a primary cooling circuit 196 using silicone oil and a secondary cooling circuit 197 using water. In other exemplary embodiments of calorimeter 101 that uses the liquid-to-liquid heat exchanger 125 shown in FIGS. 5 & 14 to create a primary cooling circuit 196 and a secondary cooling circuit 197, the coolant 145 in primary cooling circuit 196 may be a non-reactive fluid, such as, but not limited to, silicone oil, and the fluid 145 in secondary cooling circuit 197 may be comprised of water or water and other materials. The non-reactive coolant permits DC power to be used without the risk of electro-chemical reactions. In an exemplary embodiment of calorimeter 101, the heat exchanger 125 may be a liquid-to-liquid heat exchanger, such as a stainless steel, 4-port, 22-plate, counter-current heat exchanger with 0.5 m² of heat transfer area corresponding to a heat capacity of 5210 Watts. The liquid-to-liquid heat exchanger 125 allows for the use of different coolants on the primary and secondary cooling circuits.

Figure 5:
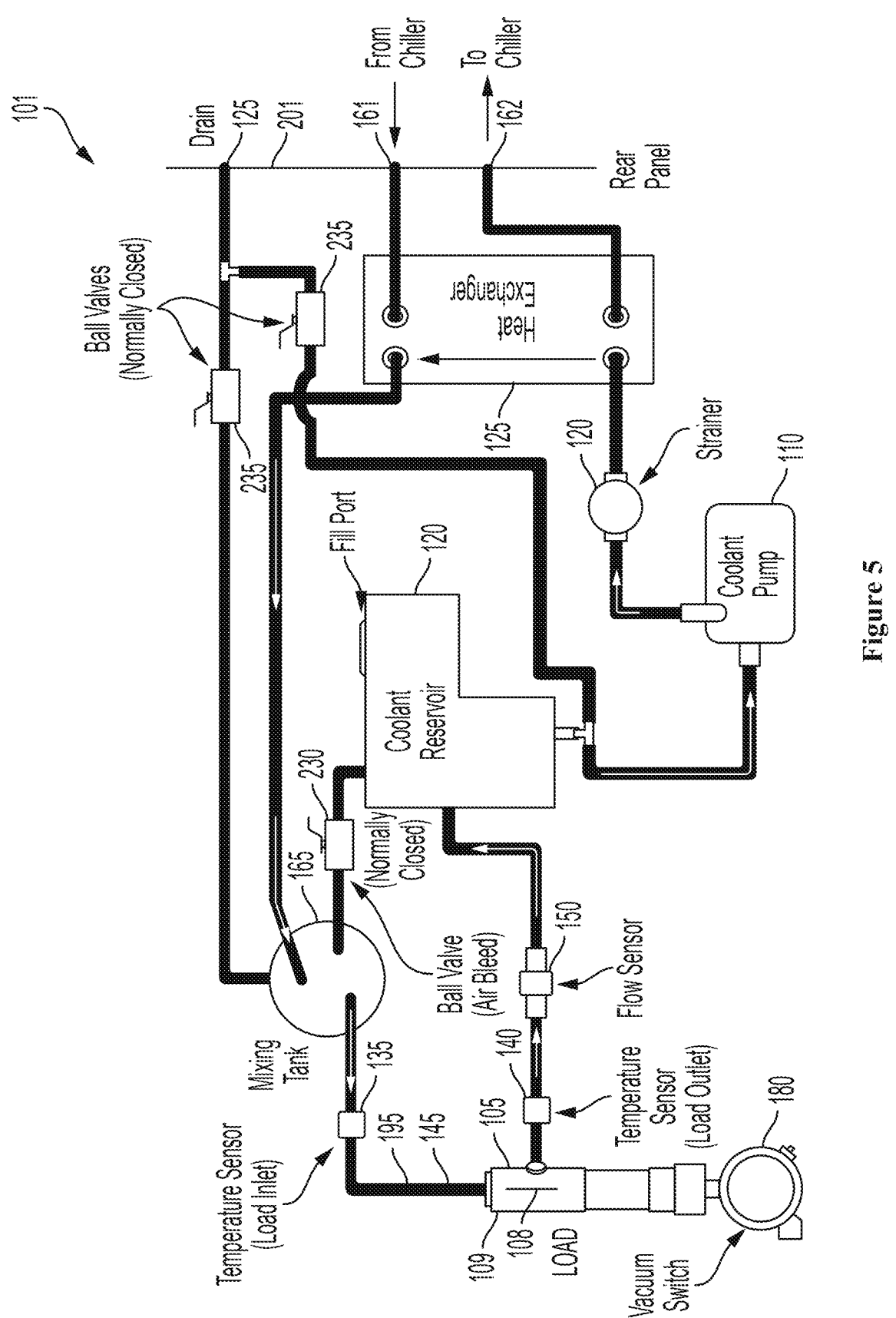
FIG. 5 shows the coolant diagram and flow path of a calorimeter in accordance with an exemplary embodiment of the invention.
Figure 13:
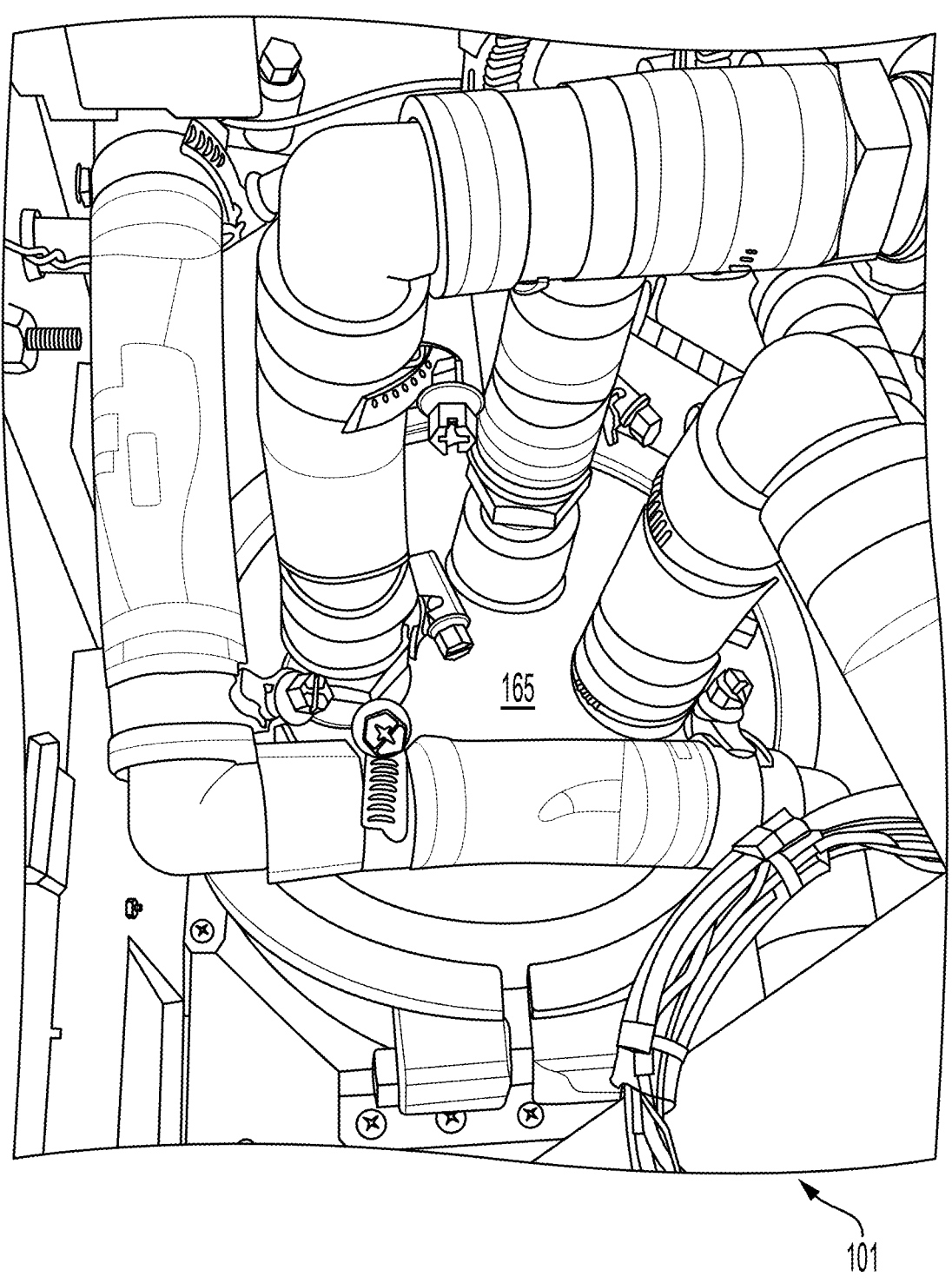
FIG. 13 shows the mixing tank which is used to mix the coolant before it enters the RF load of a calorimeter in accordance with an exemplary embodiment of the invention.

In embodiments of calorimeter 101 in which the chiller 160 is compatible with silicone oil, the use of a secondary cooling circuit 197 can be avoided and the silicone oil can be cooled directly by the chiller in cooling circuit 195 (primary cooling circuit 196). A chiller 160 that is compatible with silicone oil may include, but is not limited to, a solid-state chiller based on a Peltier device that has enough cooling capacity to cool the calorimeter 101 sufficiently. The chiller 160 directly cools the coolant. To improve the temperature stability of the coolant 145 even further, some embodiments of calorimeter 101 employ a mixing tank 165, which is also shown in FIGS. 5 and 13. The mixing tank 165 may be used to average out any short-term fluctuations in the temperature of the coolant 145 that might be caused by the dynamics of the cooling circuit 195 and/or the liquid-to-liquid heat exchanger 125. This results in a highly-stable temperature of the coolant 145 as it passes the inlet temperature sensor 135 on its way into the RF load 105.

Stated alternatively, the chiller 160 and/or heat exchanger 125 may be referred to as a heat transfer device 129, which is configured to remove heat from the coolant 145 in cooling circuit 195. In some exemplary embodiments of calorimeter 101, the heat transfer device 129 may be located between the pump 110 and mixing tank 165 on cooling circuit 195.

As was stated above, in some embodiments, coolant 145 may be water or comprised of water and other materials. In other embodiments, coolant 145 may be a type of non-reactive fluid, such as, but not limited to, silicone oil.

The cooling circuit 195 of calorimeter 101 may also include one or more air bleed valves 230 for bleeding air from the cooling circuit 195. In some exemplary embodiments, the air bleed valve 230 may be a normally closed ball valve located between the mixing tank 165 and reservoir 120. In other exemplary embodiments, an air bleed valve 230 may be placed at any location(s) along the cooling circuit 195 where a person having ordinary skill in the art sees appropriate.

The cooling circuit 195 may also include one or more drain valves 235 for draining coolant 145 from the cooling circuit 195. In some exemplary embodiments, a drain valve 235 may be located between the reservoir 120 and drain 240 and another drain valve 235 may be located between the mixing tank 165 and drain 240. The drain 240 may be located on the rear panel 201 of the main enclosure 200. In other exemplary embodiments, a drain valve 235 may be placed at any location(s) along the cooling circuit 195 where a person having ordinary skill in the art sees appropriate. The drain valve 235 may be a normally closed ball valve.

The cooling circuit 195 may also include a strainer 245 to assist with removing contaminants from the coolant 145 in the cooling circuit 195. In some exemplary embodiments, the strainer 245 may be located downstream from the pump 110, such as between the pump 110 and the heat exchanger 125, or between the pump 110 and chiller 160. In other exemplary embodiments, the strainer 245 may be placed at any location(s) along the cooing circuit 195 where a person having ordinary skill in the art sees appropriate.

Figure 16:
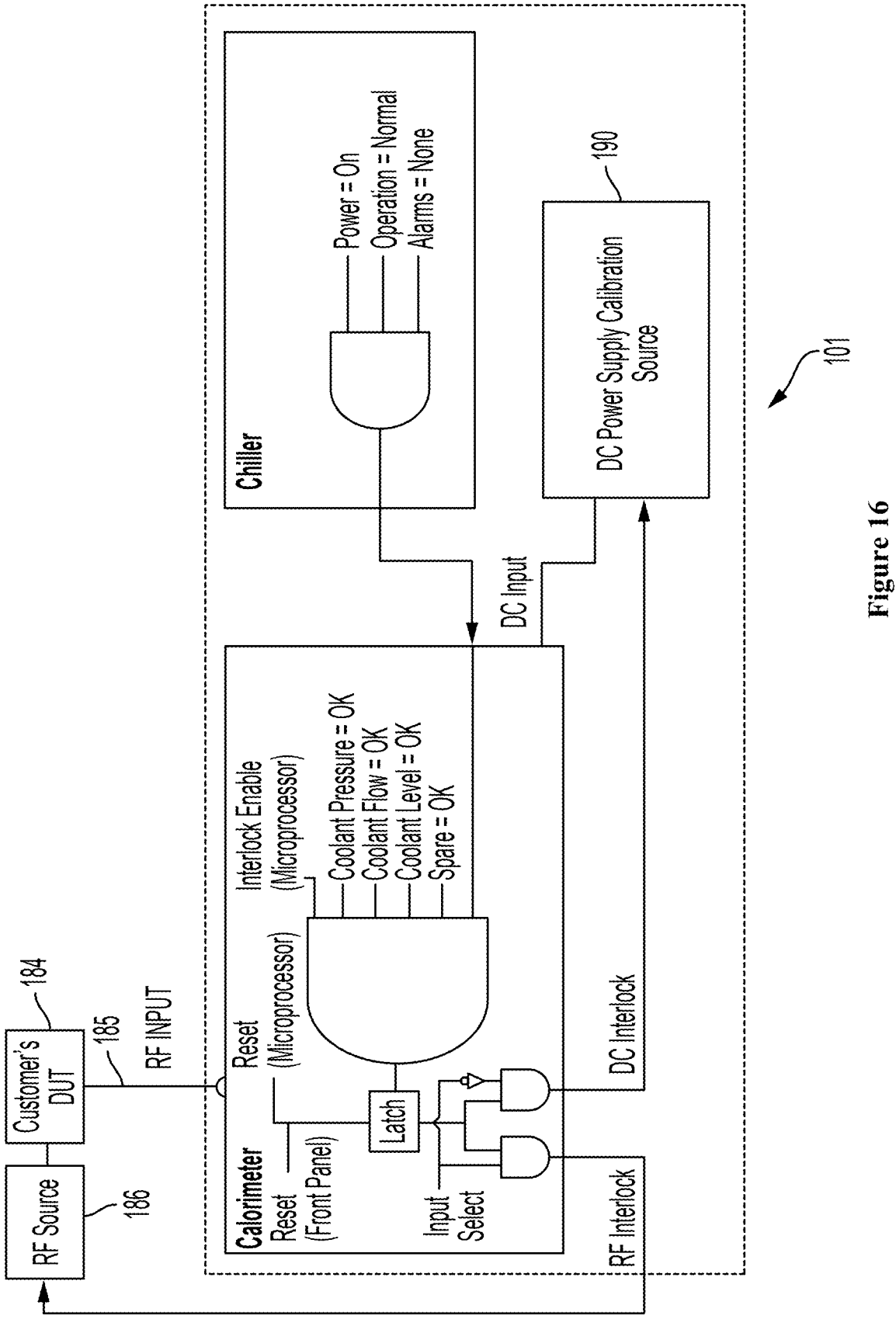
FIG. 16 shows the interlock block diagram and the logic that is used to control the interlocks of a calorimeter in accordance with an exemplary embodiment of the invention.
Figure 17:
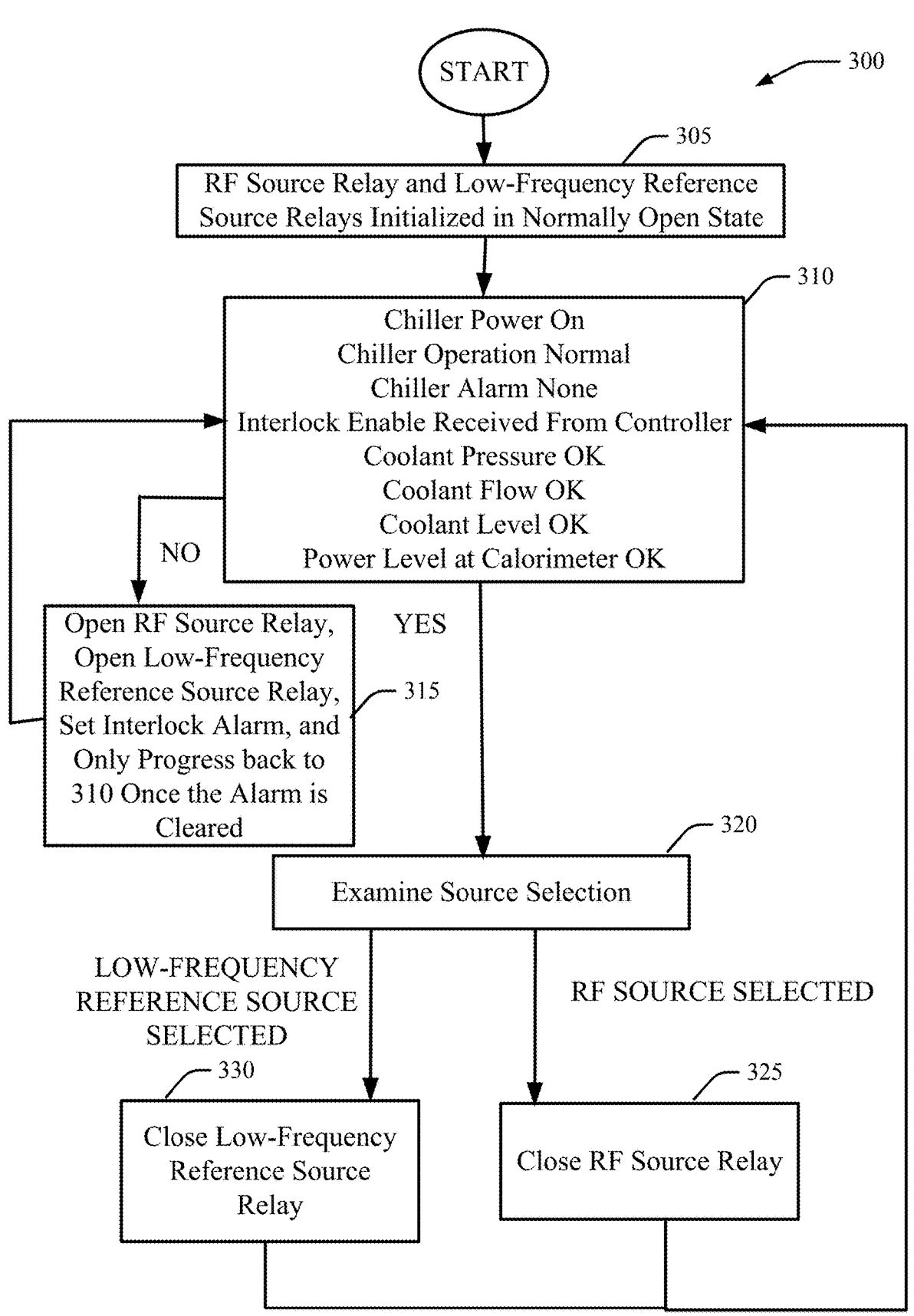
FIG. 17 shows a flowchart of the interlock that is used to control the interlocks of a calorimeter in accordance with an exemplary embodiment of the invention.

Turning to FIGS. 16 and 17, some embodiments of calorimeter 101 may have a comprehensive hardware interlock 205 that protects the calorimeter 101 from damage due to inadvertent applications of the low-frequency reference source 190 and the RF source 186. Because high-power RF calorimeters use high voltages and currents, it is prudent to provide sufficient controls to inhibit unwanted and inadvertent application of these high voltages and currents to the calorimeter. The interlock 205 helps to ensure that the high voltages and currents are only applied to the calorimeter 101 at the correct time, such as when the calorimeter 101 is ready. The interlock 205 shown in FIG. 16 controls the application of the high-power source, such as the low-frequency reference source 190 and/or RF source 186, through a pair of normally open relays when it is safe to apply the high-power source. The relays can include a low-frequency source relay 210 for the low-frequency source 190 that will provide an "enable" signal to the low-frequency reference source 190 when closed and an RF source relay 215 for the RF source 186 that will provide an "enable" signal to the RF source 186 when closed. The appropriate relay is only closed when the calorimeter 100 is running properly with sufficient coolant flow, sufficient coolant pressure, sufficient coolant level, normal operation of the chiller 160, and correct positioning of the RF switch 180 (in the position corresponding to the low-frequency reference source 190 for the low-frequency source relay 210 and in the position corresponding to the RF source 186 for the RF source relay 215). In an exemplary embodiment, normal operation of the chiller 160 will be confirmed when a first terminal of the chiller terminal block 208 on the rear panel 201 of the main enclosure 200 send a voltage signal to the chiller 160 and the voltage signal is received back from the chiller 160 at the second terminal of the chiller terminal block 208. In some exemplary embodiments, the low-frequency source relay 210 and the RF source relay 215 may be located on the rear panel 201 of the main enclosure 200. If any condition fails to be met, including due to a power loss at the calorimeter 101, the interlock 205 will enter an alarm state and the interlock relays, low-frequency source relay 210 and RF source relay 215, will immediately return to their normally open state, removing the "enable" signal sent to either of the high-power sources, thereby disabling any power from either of the high-power sources (the low-frequency reference source 190 and the RF source 186). Furthermore, when the interlock system 205 enters the alarm state, the alarm state is latched such that user intervention is required to clear the alarm state. In one exemplary embodiment, the user intervention required to clear the alarm may be the pressing of a reset button 174 on the user interface 170 on the front panel 202 of the main enclosure 200. In other exemplary embodiments, the user intervention required to clear the alarm may be the pressing of a reset button in the web-interface, which may prompt the controller 130 to provide the command to clear the alarm to the hardware interlock 205. This required user intervention prevents the system from continually toggling the alarm state of the interlock system 205 when an intermittent condition exists that triggers an alarm state.

In some exemplary embodiments, the interlock 205 may have a terminal block 209 mounted on the rear panel 201 of the main enclosure 200. The terminal block 209 may have terminals for the low-frequency reference source relay 210 for interfacing with the enable interlock of the low-frequency reference source 190 when the low-frequency reference source 190 is located external to the main enclosure 200 The terminal block 209 may also have terminals for the RF source relay 215 for interfacing with the enable interlock of the RF source 186, such as when the RF source 186 is providing power to an RF power measurement device under test 184 connected to the RF input 185 on the front panel 202 of the main enclosure 200. It is contemplated that the terminals for the low-frequency reference source relay 210 may be located elsewhere on the calorimeter 201, when the low-frequency reference source 190 is located inside the main enclosure 200. Further, in some exemplary embodiments, the chiller terminal block 208 is located on the rear panel 201 of the outer enclosure 200. It is contemplated that in other exemplary embodiments, chiller terminal block 208 may be located elsewhere on the calorimeter 201, when the chiller 160 is located inside the main enclosure 200 of the calorimeter 101.

Figure 6:
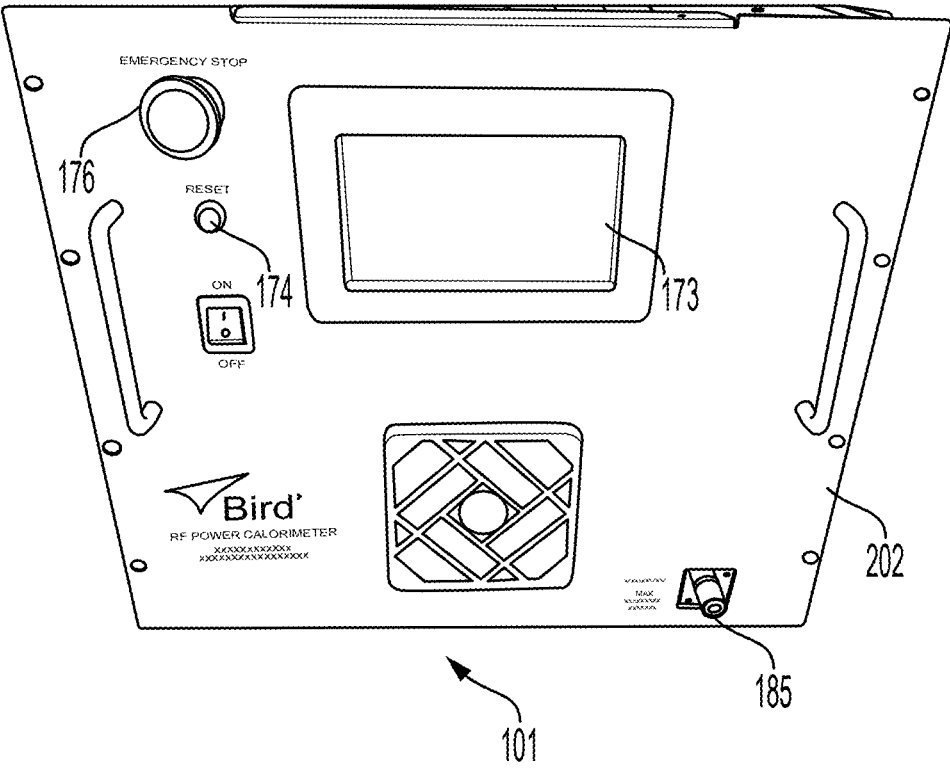
FIG. 6 shows the front panel of a calorimeter in accordance with an exemplary embodiment of the invention.
Figure 7:
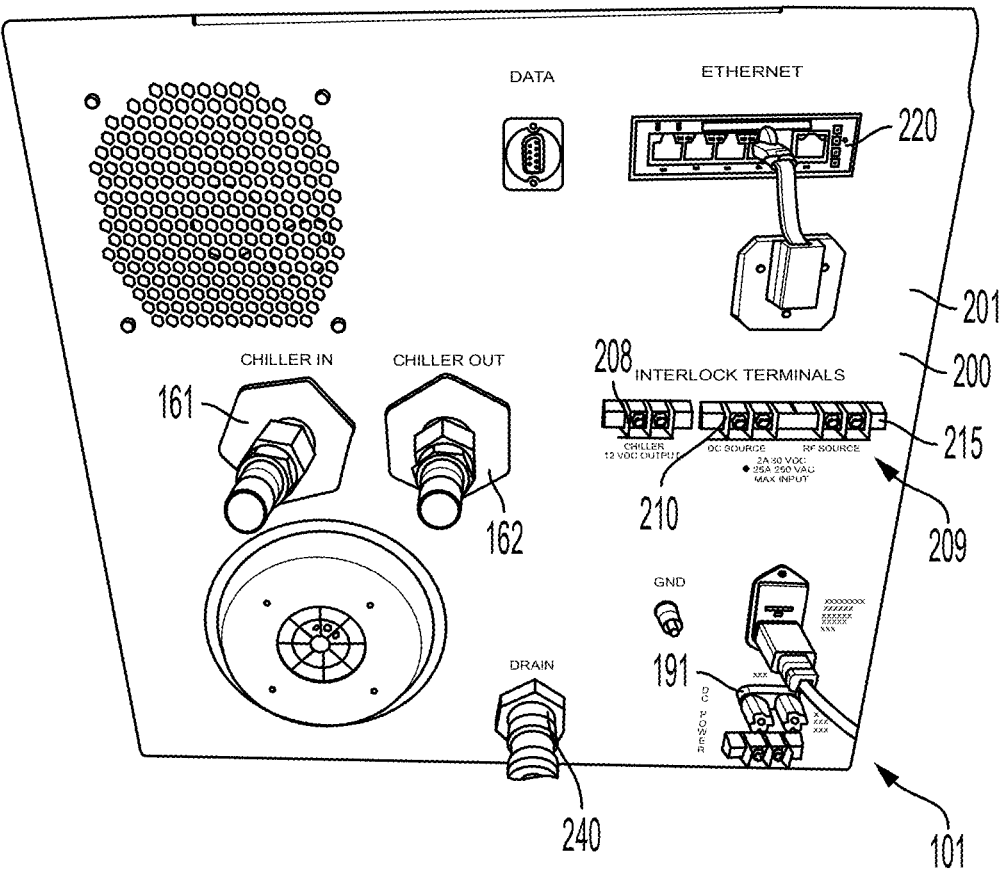
FIG. 7 shows the rear panel of a calorimeter in accordance with an exemplary embodiment of the invention.

FIG. 6 shows the front panel 202 of the main enclosure 200 of the calorimeter 101, which has an RF input 185, emergency stop button 176, reset button 174, and LCD screen 173. FIG. 7 shows the rear panel 201 of the main enclosure 200 of the calorimeter 101, which has ethernet port 220, chiller terminal block 208, interlock terminal block

209, low-frequency reference source relay 210, RF source relay 215. The rear panel 201 also has chiller inlet 161 and chiller outlet 162 The rear panel 201 further has drain 240 and low-frequency input 191.

Figure 8:
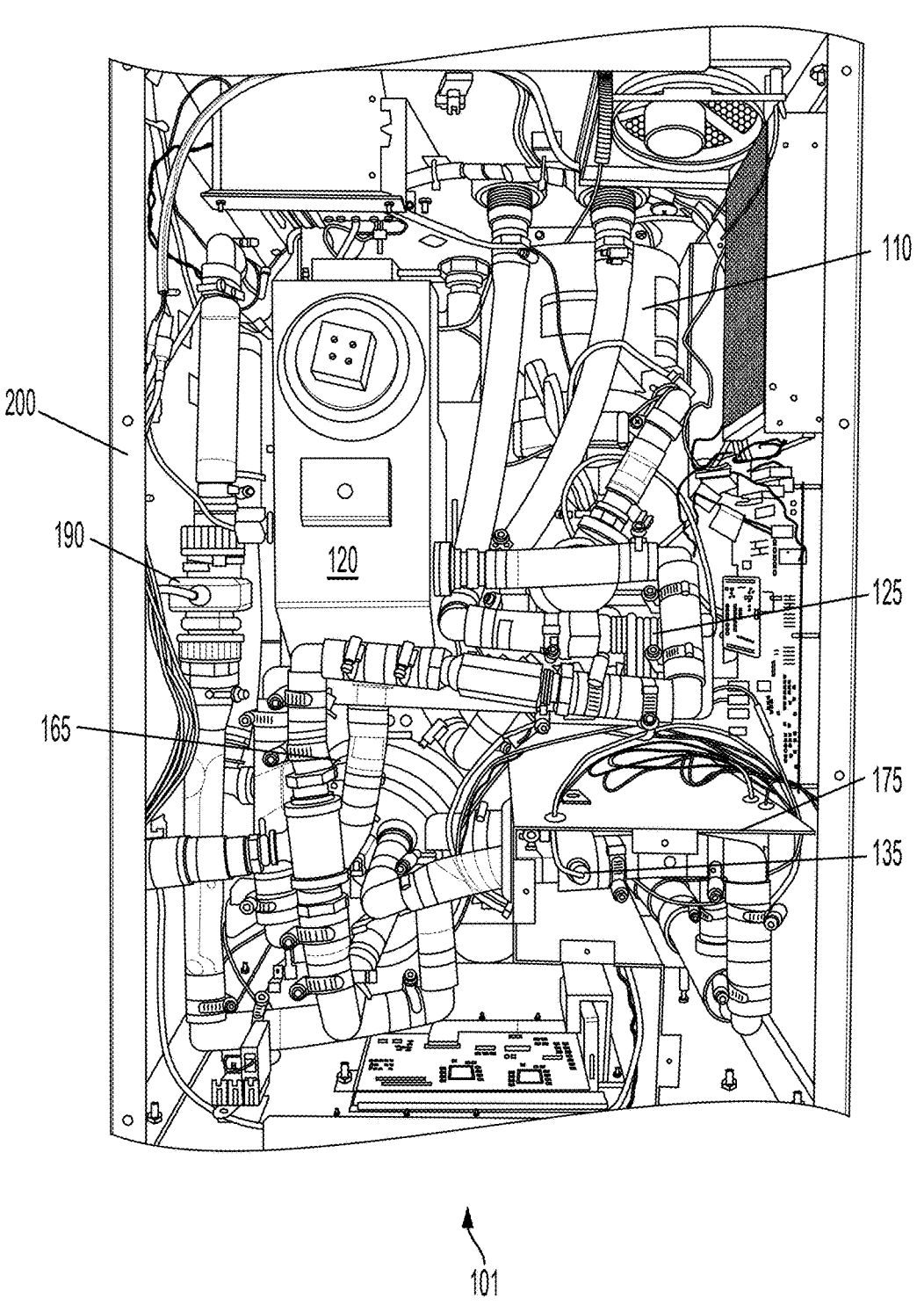
FIG. 8 shows the top view of embodiment calorimeter with cover off in accordance with an exemplary embodiment of the invention.

FIG. 8 shows the top view of an embodiment of calorimeter 101 with cover off of the main enclosure 200, which depicts pump 110, heat exchanger 125, low-frequency reference source 190, mixing tank 165, and inlet temperature sensor 135 in temperature-controlled enclosure 175. FIG. 9 shows a close up of the top view of calorimeter 101 with cover off of the main enclosure 200, which depicts the temperature-controlled enclosure 175 where the RF load 105, inlet temperature sensor 135, and outlet temperature sensor 140.

Figure 10:
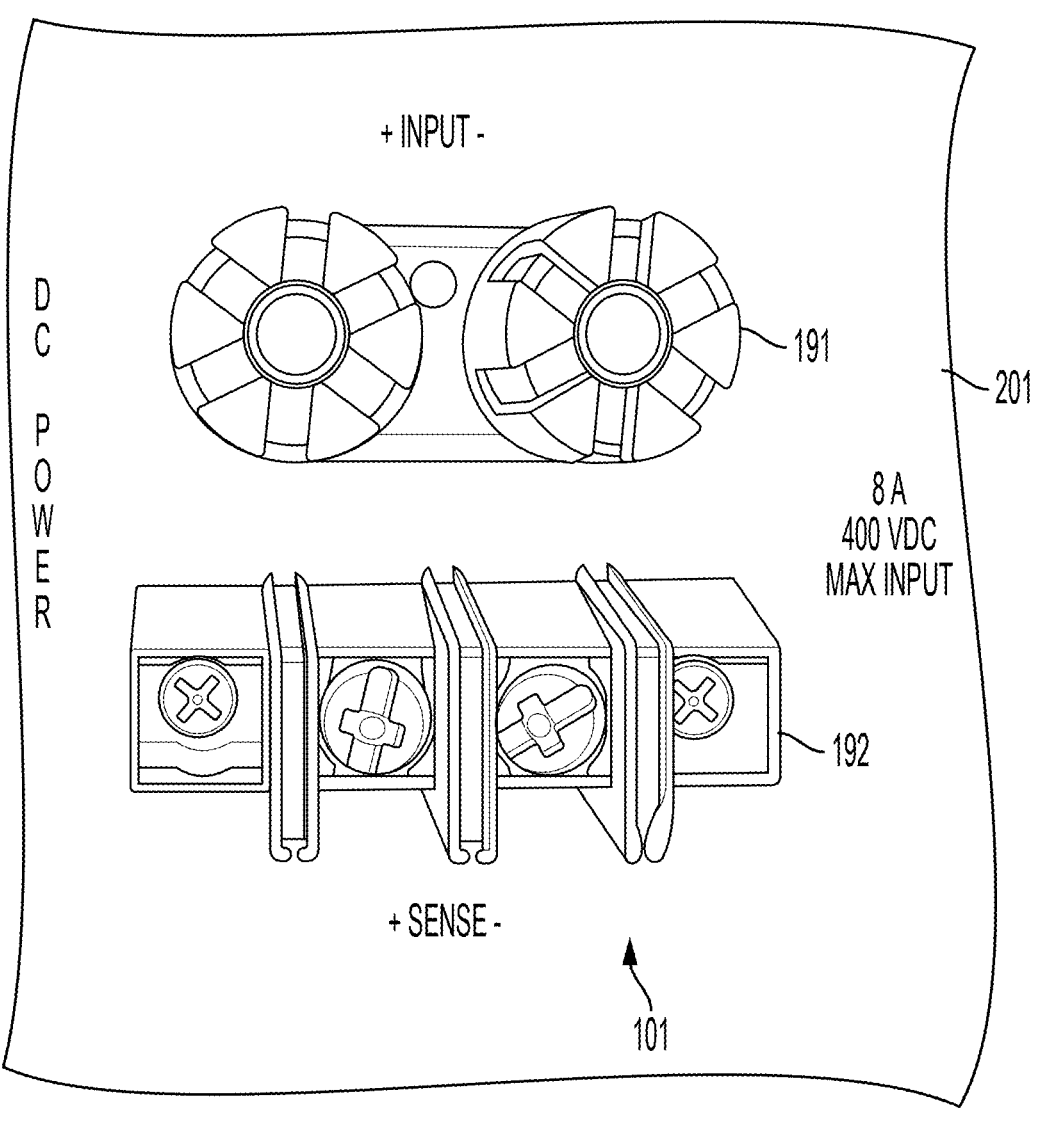
FIG. 10 shows the electrical connections for the external DC source, including the high-power input and sense wire connections of a calorimeter in accordance with an exemplary embodiment of the invention.
Figure 11:
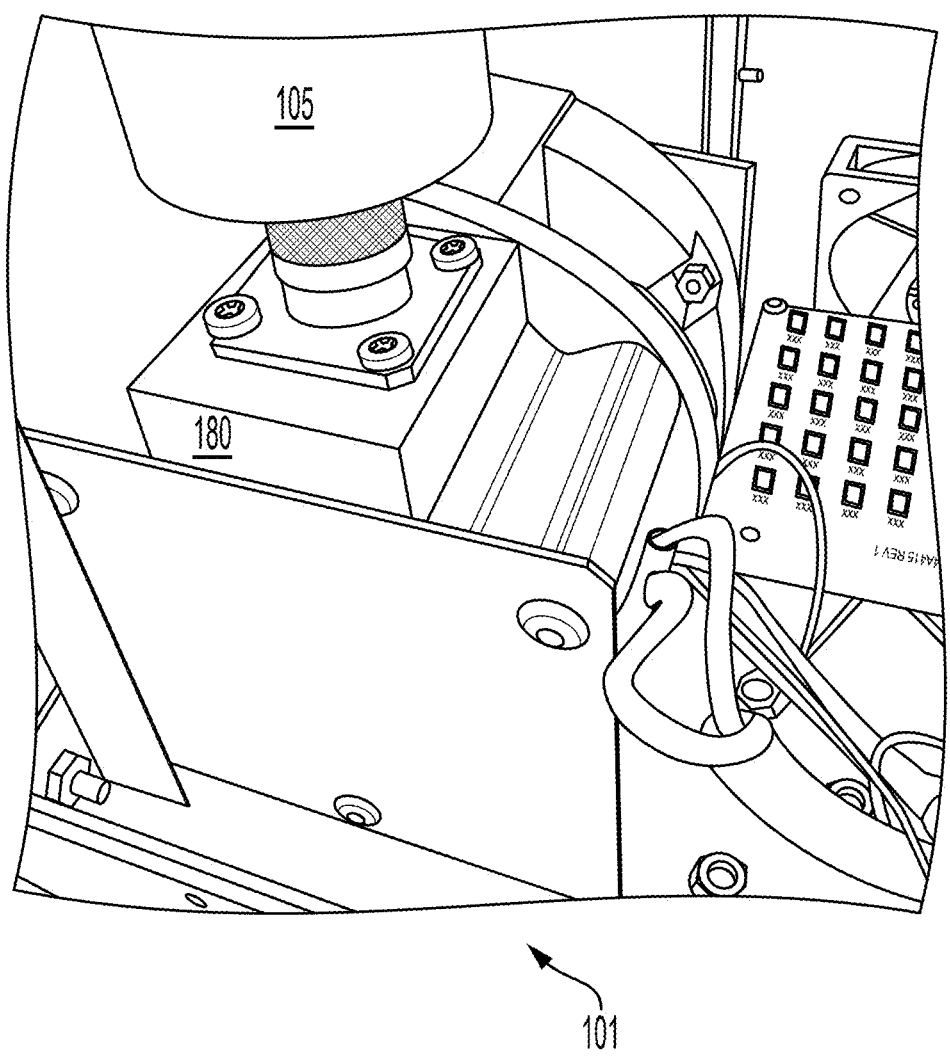
FIG. 11 shows the RF switch assembly and its connection to the RF load of a calorimeter in accordance with an exemplary embodiment of the invention.
Figure 12:
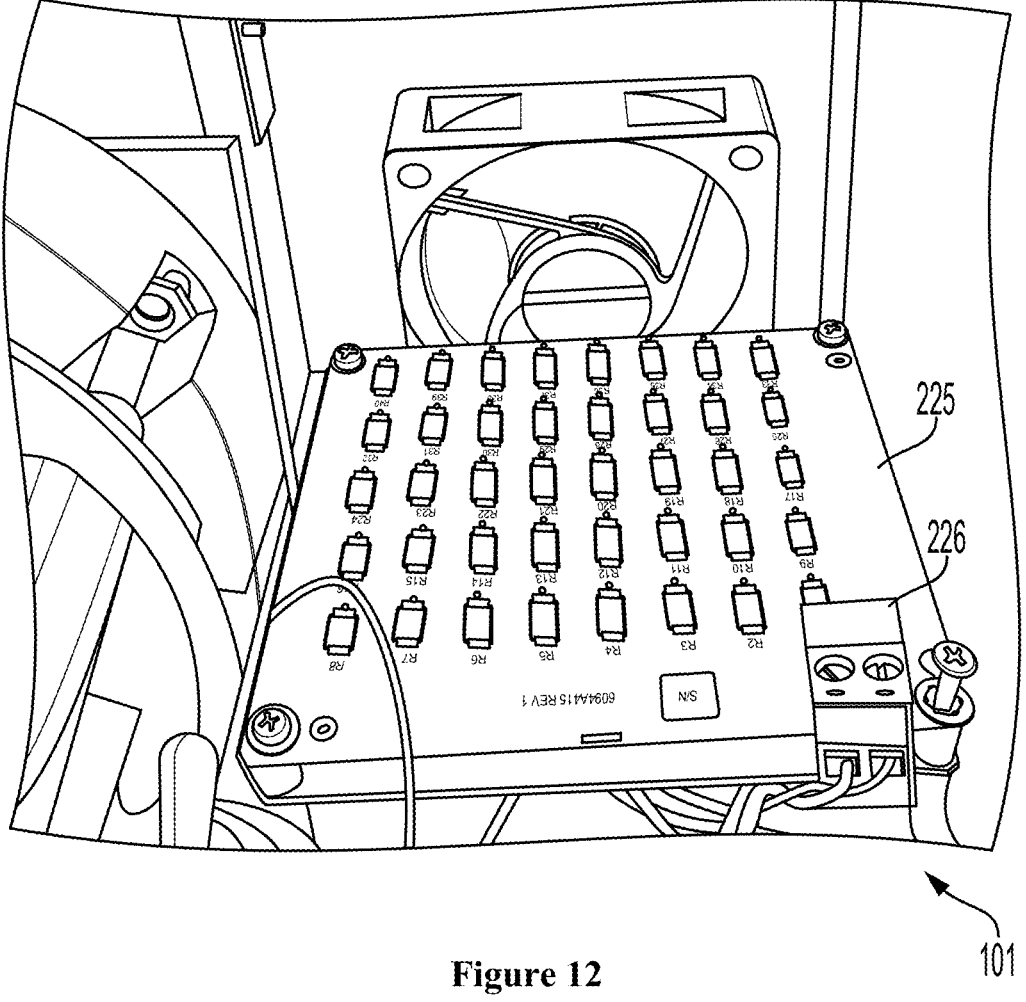
FIG. 12 shows the closed-loop heater that is used to control the temperature of the RF load enclosure of a calorimeter in accordance with an exemplary embodiment of the invention.

FIG. 10 shows the electrical connections for the external DC source 190, including the high-power input 191 and sense 192 wire connections on the rear panel 201 of the calorimeter 101. FIG. 11 shows the RF switch assembly 180 and its connection to the RF load 105 of the calorimeter 101. FIG. 12 shows the closed-loop heater 225 with closed-loop heater controller 226 that is used to control the temperature of the temperature-controlled enclosure 175.

Figure 14:
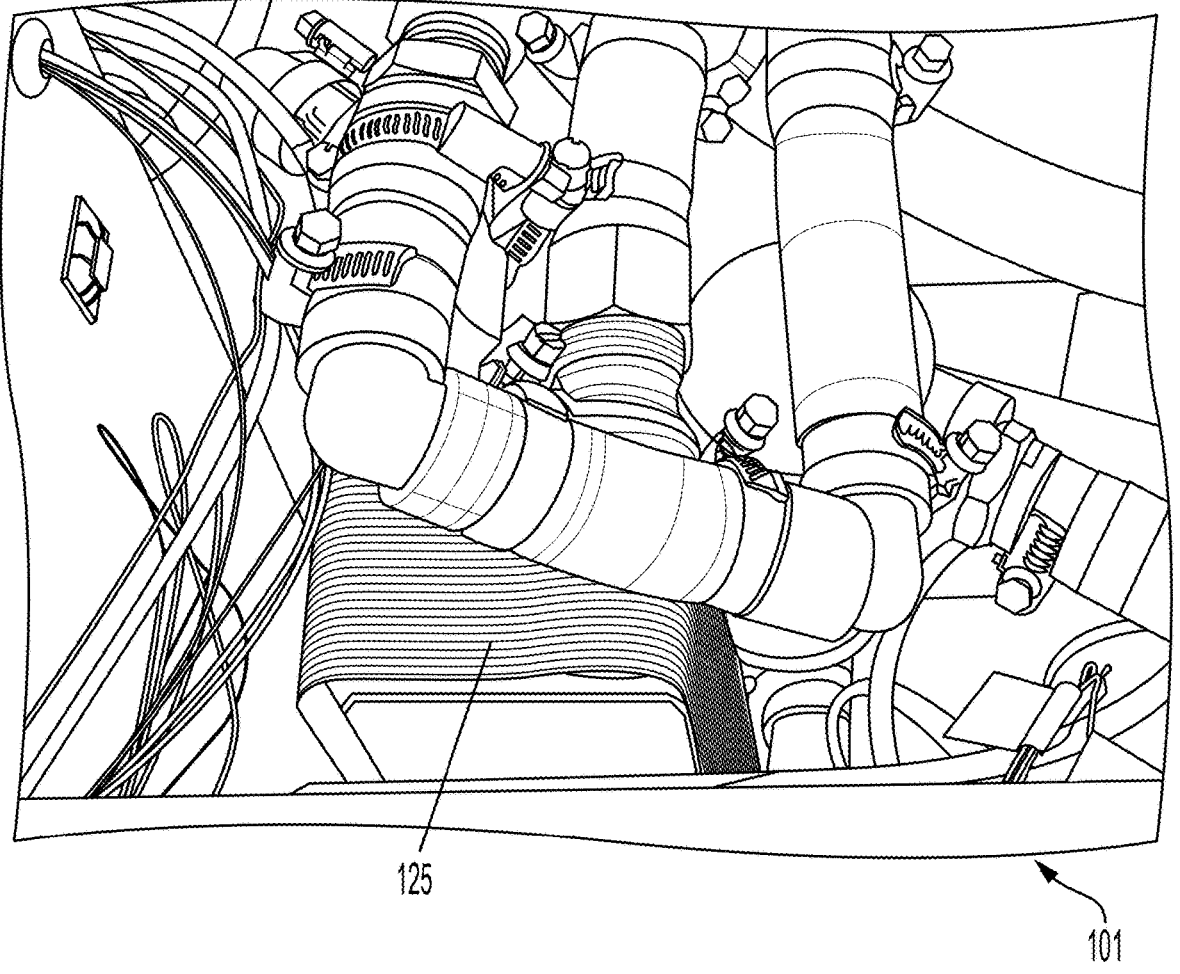
FIG. 14 shows the liquid-to-liquid heat exchanger which is used to provide primary and secondary cooling circuits that can use different types of coolants of a calorimeter in accordance with an exemplary embodiment of the invention.
Figure 15:
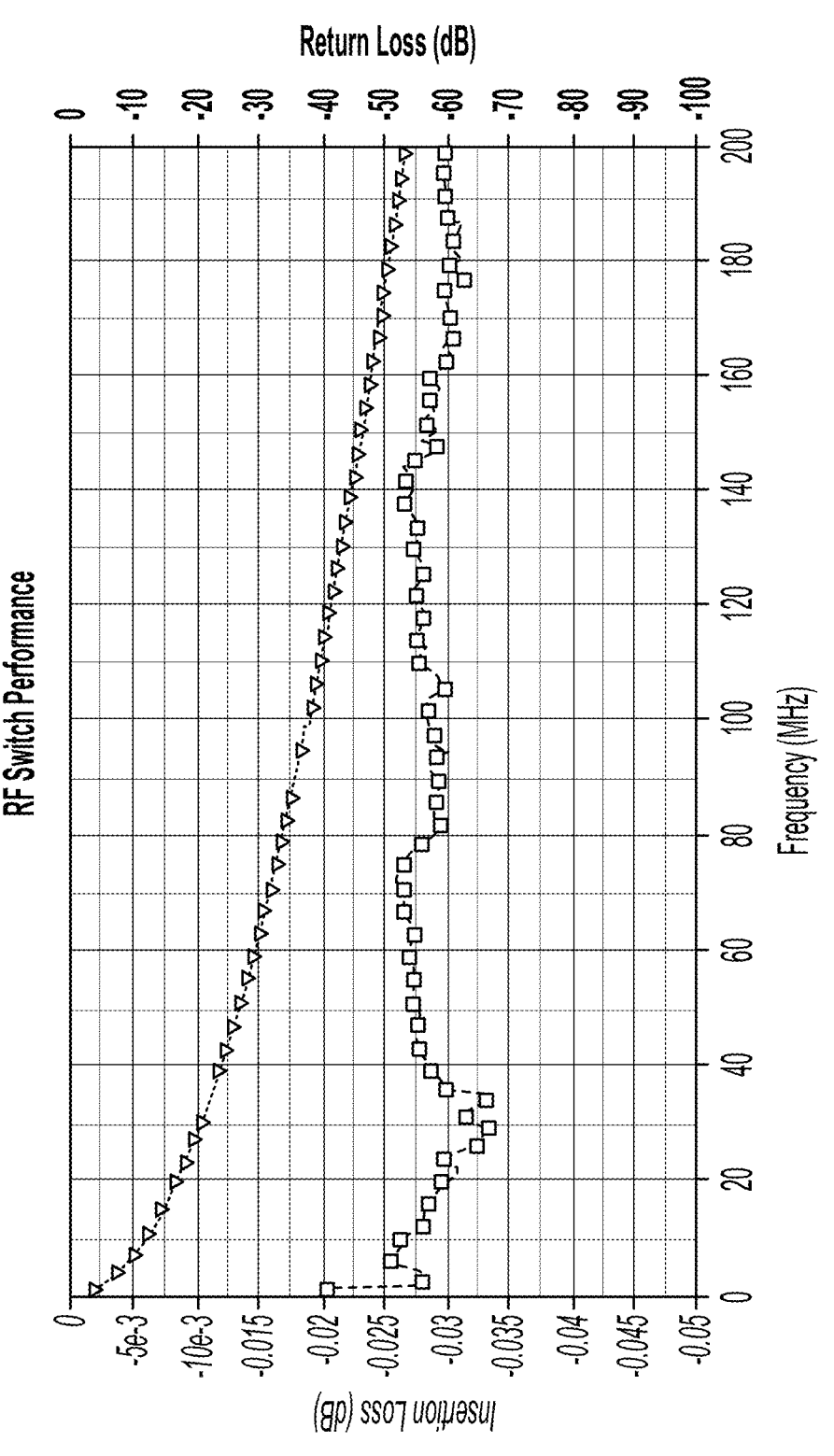
FIG. 15 shows the measured performance of the RF switch, highlighting its low insertion loss and low return loss of a calorimeter in accordance with an exemplary embodiment of the invention.

FIG. 13 shows the mixing tank 165 which is used to mix the coolant 145 before it enters the RF load 105 of a calorimeter 101. FIG. 14 shows the liquid-to-liquid heat exchanger 125 that is used to provide primary cooling circuit 196 and secondary cooling circuit 197 of the calorimeter 101. The primary cooling circuit 196 and secondary cooling circuit 197 can use different types of coolants 145.

Another advantage of an exemplary embodiment of the calorimeter 101 is the use of machine learning techniques to create the most comprehensive model of the calorimeter 101 describing the relationship between all sensor inputs received by controller 130 and the resulting calculation of RF power. Incorporating machine learning into the calorimeter 101 enhances its predictive accuracy and adaptability. By using machine learning the calorimeter 101 is less susceptible to variability in ambient conditions and can measure the power applied to the load 105 more accurately over a wider range of power levels. In an exemplary embodiment, the calorimeter 101 can operate within an environment having an ambient air temperature between the range of about 20° C. to about 30° C. without any other environmental control requirements. In some embodiments, the calorimeter 101 can measure power levels from about 1000 Watts to about 3000 Watts.

Figure 18:
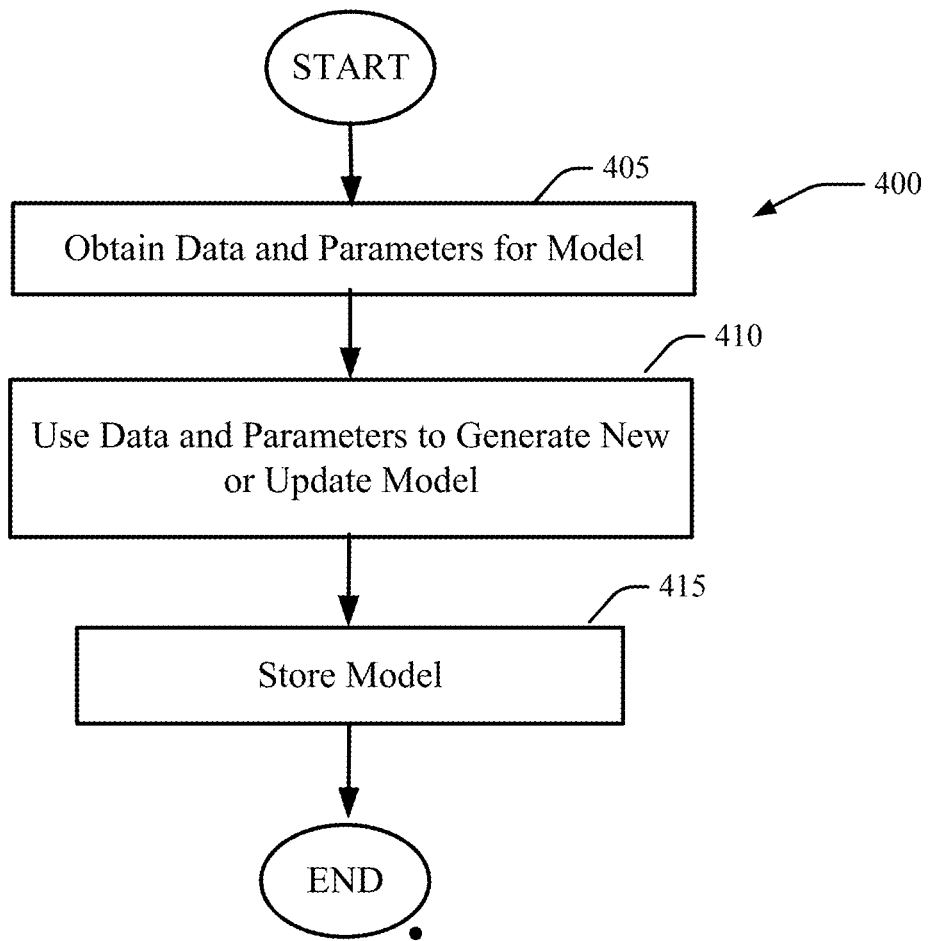
FIG. 18 shows a flowchart for the training of a model of a calorimeter in accordance with an exemplary embodiment of the invention.

The model of calorimeter 101 can be trained using sensor data acquired by the controller 130 during self-calibration of calorimeter 101 upon request by the user or when certain thresholds are reached, such as using the method 400 shown in FIG. 18. Such threshold may include, but are not limited to, initial startup, the elapsing of a predetermined length of time since the last training/calibration, exceeding a predetermined number of measurements since last training/calibration, a predetermined threshold for one or more variable, a measurement value that is outside of the frequency range of a stored model, a measurement value that is outside of the power range of a stored model. In 405, parameters for the model may include, but are not limited to, the desired frequency range for the calibration and/or the desired power range for the calibration, can be obtained from the user through the user interface 170 and provided to controller 130. Sensor data is then obtained using the controller 130 and various sensors of calorimeter 101. The sensor data can include, but is not limited to, variables such as coolant flow rate obtained by flow sensor 150, coolant temperature at inlet of load 105 using inlet temperature sensor 135, coolant temperature at outlet of load 105 using outlet temperature sensor 140, ambient temperature within main enclosure 200 using enclosure ambient temperature sensor 152, ambient temperature within the temperature-controlled enclosure 175 using the temperature-controlled enclosure ambient temperature sensor 153, and power measurements taken using the inlet temperature sensor 135 and outlet temperature sensor 140 and calculated by controller 130, when a known power value is applied to the load 105, such as by the low-frequency reference source 190 having a known power value output, such as a DC reference standard or an AC reference standard.

In 410, the data and parameters are then used to generate a new model and/or update an existing model of calorimeter 101. Some linear regression models that can be used for the model of calorimeter 101 include, but are not limited to, a simple linear regression model, a Ridge regression model, and a Lasso regression model. Other linear regression models that can be used for the model of calorimeter 101 include, but are not limited to, a Decision Tree Regressor, a Support Vector Regressor, and a Gradient Boosting Regressor. The model is then stored in memory 132 of controller 130 in 415.

Figure 19:
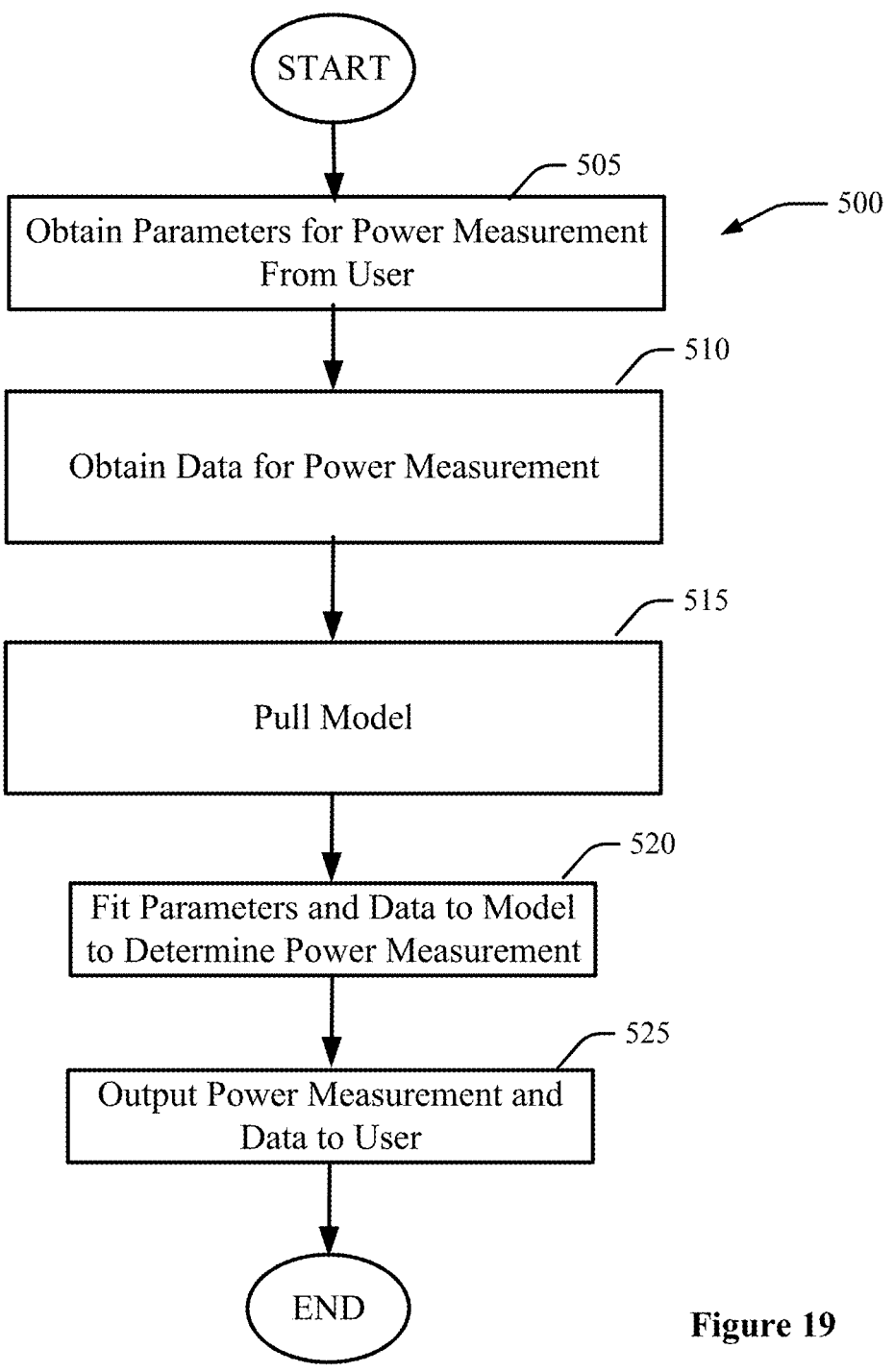
FIG. 19 shows a flowchart for a power measurement of a calorimeter using the model trained in FIG. 18, in accordance with an exemplary embodiment of the invention.

Once the model of the calorimeter 101 is generated, the model can then be used to measure RF power provided to the RF input 185 by the RF power source, such as is shown in the method 500 in FIG. 19. In 505, parameters for the power measurement may be obtained from the user through the user interface 170, provided to controller 130 and stored in memory 132. In 510, data for the power measurement can be obtained by the controller 130 and stored in memory 132. The dataset can include, but is not limited to variables such as coolant flow rate obtained by flow sensor 150, coolant temperature at inlet 106 of load 105 using inlet temperature sensor 135 inlet temperature, coolant temperature at outlet 107 of load 105 using outlet temperature sensor 140, coolant outlet temperature, ambient temperature within main enclosure 200 using enclosure ambient temperature sensor 152, the ambient temperature measured within the heated temperature-controlled enclosure 175 using the temperature-controlled enclosure ambient temperature sensor 153.

In 515, the model is pulled from memory 132 of controller 130. In some embodiments, the pulled model may be the most recently created or updated model. In other embodiments, the pulled model may be the most pertinent model as determined by the comparison of some variables obtained in 510.

In 520, the parameters and data are fit to the model using processor 131 of controller 130 to determine the power measurement of the RF power source.

In 525, the power measurement is outputted to the user via the user interface 170 and saved in memory 132. Other data may also be outputted to the user and saved in memory 132.

Thus as can be seen, the calorimeter 101 and method 500 of using calorimeter 101 both use machine learning techniques to model the relationships between RF power, temperature, flow, and ambient conditions. The machine learning techniques can include generating and updating a model of the calorimeter 101. Further, the machine learning techniques can further include utilizing linear regression models, such as, but not limited to a simple linear regression model, Ridge regression model, and/or a Lasso regression model. The linear regression models may also include, but are not limited to a Decision Tree Regressor, Support Vector Regressor, and/or Gradient Boosting Regressor.

Further, the relationships between RF power, temperature, flow, and ambient conditions may include, but are not limited to, coolant flow rate obtained by flow sensor 150, coolant temperature at inlet 106 of load 105 using inlet temperature sensor 135 inlet temperature, coolant temperature at outlet 107 of load 105 using outlet temperature sensor 140, coolant outlet temperature, ambient temperature within main enclosure 200 using enclosure ambient temperature sensor 152, the ambient temperature measured within the heated temperature-controlled enclosure 175 using the temperature-controlled enclosure ambient temperature sensor 153.

Also disclosed is a method of a measuring RF power using the calorimeter 101, including, using temperature measurements of the coolant 145 in thermal contact with load 105 in combination with a low-frequency reference source 190 to measure RF source 186 having an unknown power value.

Further disclosed is an additional method of measuring RF power using calorimeter 101. The method of measuring RF power includes: providing calorimeter 101 having load 105 electrically coupled to the RF input 185; and providing a coolant 145 thermally coupled to the load 105. The method further includes; controlling the RF switch 180 to direct power from the known low-frequency reference source 190 to the load 105, the known low-frequency reference source 190 having a predetermined range of power values. Next, the difference in temperature of the coolant at the inlet 106 and outlet 107 of the load 105 is measured during the application of power from the low-frequency reference source 190. The method further includes creating a model of the difference in temperature of the coolant compared to the applied power from the low-frequency reference source 190. The model may include a correction to account for any power loss in the RF switch 180. The method further includes controlling the RF switch 180 to direct power from the unknown RF source 186 through the RF input 186 to the load, and measuring the difference in temperature of the coolant at the inlet 106 and outlet 107 of the load 105 during the application of power from the unknown RF source 186. The method also includes applying the model of the difference in temperature compared to the applied power to calculate the power of the unknown RF source 186. Thereby, this method of using an RF calorimeter self-calibrates the calorimeter using the low-frequency reference source 190 in near real time, to achieve a total uncertainty of less than about ±0.25% using substitution. As can be seen, the RF switch 180 permits the switching between measurement of the low-frequency reference source 190 and measurement of the unknown RF source 186 to allow for self-calibration of the calorimeter 101.

Figure 20:
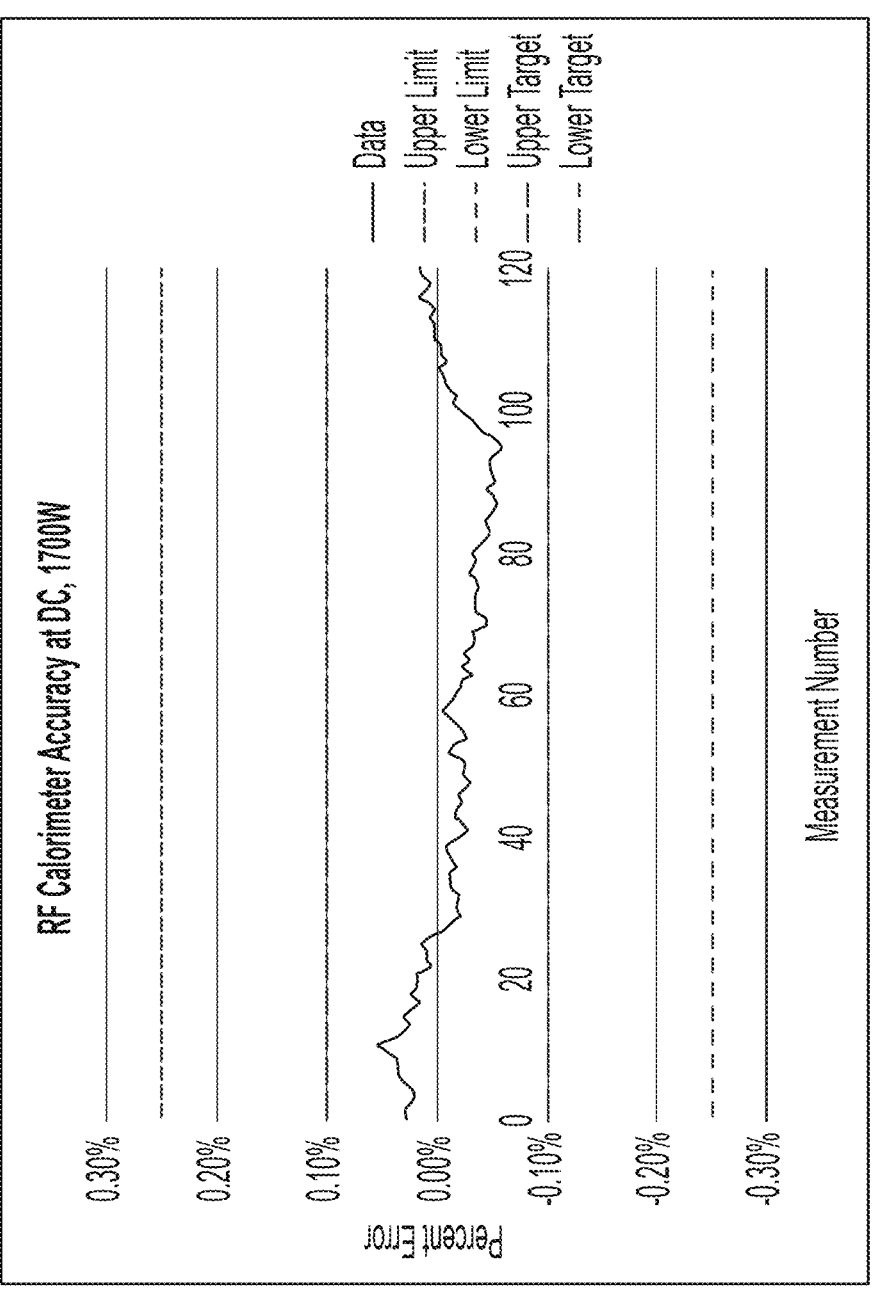
FIG. 20 shows the measured accuracy of the calorimeter at DC and 1700 Watts in accordance with an exemplary embodiment of the invention.
Figure 21:
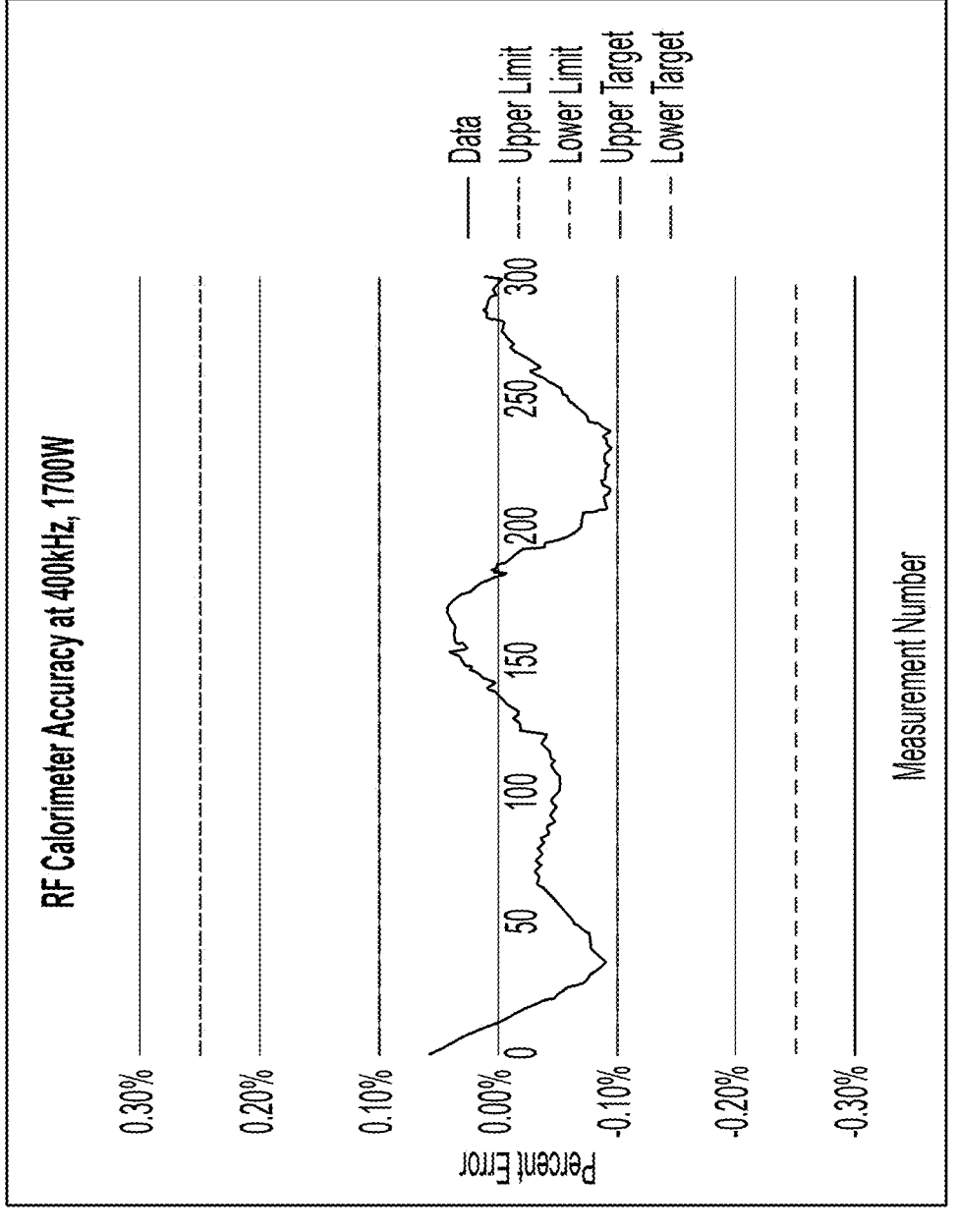
FIG. 21 shows the measured accuracy of the calorimeter at 400 kHz and 1700 Watts in accordance with an exemplary embodiment of the invention.
Figure 22:
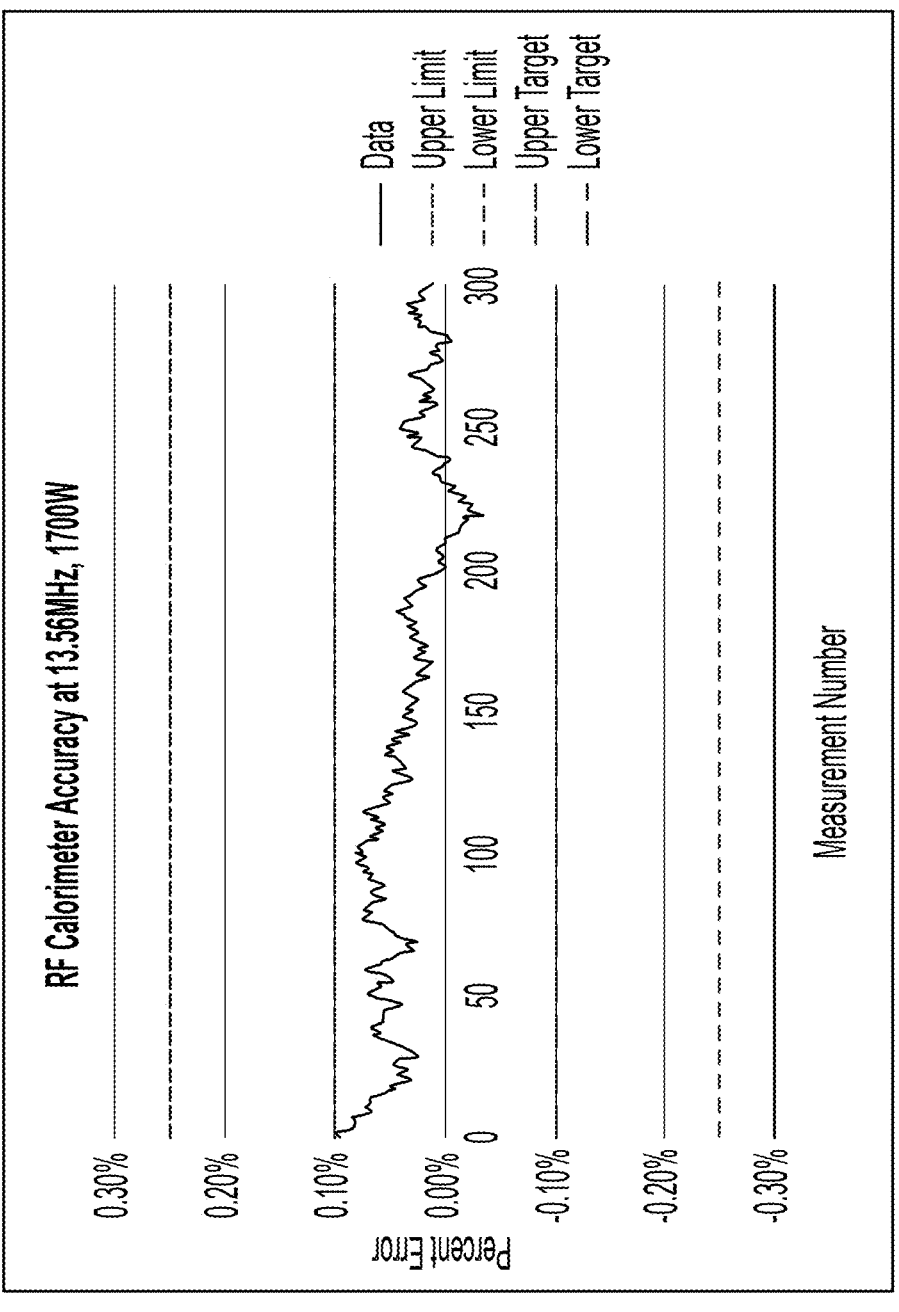
FIG. 22 shows the measured accuracy of the calorimeter at 13.56 MHz and 1700 Watts in accordance with an exemplary embodiment of the invention.

The increased performance of calorimeter 101 is demonstrated in FIGS. 20-23. FIG. 20 shows the measured accuracy of the calorimeter 101 at DC and 1700 Watts. Additionally, FIG. 21 demonstrates the measured accuracy of the calorimeter 101 at 400 kHz and 1700 Watts. Further, FIG. 22 shows the measured accuracy of the calorimeter 101 at 13.56 MHz and 1700 Watts. Additionally, FIG. 23 shows the uncertainty contribution of a DC reference source, such as is in calorimeter 101, in comparison to an AC reference source of a calorimeter, such as is in prior art calorimeters 100. As can be seen, calorimeter 101 has significant performance increases when compared to prior art calorimeters 100.

While this invention has been described in conjunction with the specific embodiments described above, it is evident that many alternatives, combinations, modifications and variations are apparent to those skilled in the art. Accordingly, the preferred embodiments of this invention, as set forth above are intended to be illustrative only, and not in a limiting sense. Various changes can be made without departing from the spirit and scope of this invention. Combinations of the above embodiments and other embodiments will be apparent to those of skill in the art upon studying the above description and are intended to be embraced therein. Therefore, the scope of the present invention is defined by the appended claims, and all devices, processes, and methods that come within the meaning of the claims, either literally or by equivalence, are intended to be embraced therein.

The invention claimed is:

1. A radio frequency (RF) calorimeter, comprising:
a low-frequency reference source, said low-frequency reference source is integrated into said calorimeter, thereby permitting said calorimeter to self-calibrate using said low-frequency reference source;
a controller configured to self-calibrate said calorimeter on-demand immediately prior to measuring a power value of an RF source having an unknown power;
said calorimeter having a measurement accuracy with an uncertainty of less than about ±0.25%,
wherein said calorimeter uses a silicon oil as a coolant.

2. The RF calorimeter of claim 1, wherein said calorimeter is a high-power flow calorimeter capable of maintaining National Metrology Institute (NMI) traceable measurement accuracy at frequencies up to about 3 GHz and power levels up to about 3000 Watts.

3. The RF calorimeter of claim 1, further comprising an RF input and a load, said load having a body and an internal resistor located inside of said body, said internal resistor being electrically connected to said RF input, said internal resistor being in thermal contact with a coolant;
said load having a very high thermal efficiency to maximize a transfer of an RF power that is applied to said internal resistor through said RF input into thermal energy in said coolant flowing through said load, wherein said internal resistor converts said RF power to thermal energy and transfers said thermal energy to said coolant in thermal communication with said internal resistor while said coolant is flowing through said load, thereby minimizing RF power lost by thermal transfer through said body and minimizing RF power lost by thermal transfer through said RF input, said RF power lost through said RF input either lost through a center conductor or an outer conductor of said RF input, thereby no RF power is lost by thermal transfer from the internal resistor through said body of said load to an environment surrounding said body of said load, wherein said RF calorimeter optionally has a silver plated quartz tube providing mechanical and electrical connection between said RF input and said load, wherein said RF power lost by thermal transfer through said body and through said RF input contributing to less than about ±0.018% of total system uncertainty.

4. The RF calorimeter of claim 1, wherein said controller uses machine learning to generate and update a model of said calorimeter based on continuously acquired sensor data obtained during power measurements, thereby enhancing a predictive accuracy of said calorimeter for power measurements under varying conditions.

5. The RF calorimeter of claim 1, wherein said uncertainty of said power measurement of said calorimeter enables a calibration of an RF power measurement device under test to uncertainties of less than about ±0.5%, when said RF power measurement device is calibrated to said calorimeter.

6. The RF calorimeter of claim 1, wherein said measurement accuracy of said calorimeter enables an extension of a time between calibrations of an RF power measurement device under test having about ±1% uncertainty or higher when said RF power measurement device under test is calibrated to said calorimeter, since said measurement accuracy of said calorimeter results in an increase in a test accuracy ratio (TAR) between an RF power measurement device under test and said calorimeter.

7. The calorimeter of claim 1, wherein said low-frequency reference source being located inside a main enclosure of said calorimeter.

8. The RF calorimeter of claim 3, further comprising a temperature-controlled enclosure for the load, said temperature-controlled enclosure isolating said load from changes to an ambient environment of said calorimeter, thereby ensuring that a thermal gradient between a coolant at an inlet of said load and said ambient environment is kept constant to minimize any error associated with said thermal gradient.

9. The RF calorimeter of claim 3, wherein said load for converting said RF power to a thermal energy is comprised of one or more individual loads.

10. The RF calorimeter of claim 3, further comprising an RF switch, which permits for electrically controlled switching between said low-frequency reference source and said RF source having said unknown power connected to said RF input, said RF switch having an insertion loss between about −0.0025 dB and about −0.0275 dB and return loss between about −40 dB and about −68 db over the frequency of operation, and said RF switch optionally comprises an impedance-matched vacuum relay.

11. The RF calorimeter of claim 3, wherein said use of said silicon oil as said coolant permits for an application of DC power to said load without a risk of electro-chemical reactions between said coolant and said load; wherein said coolant is cooled using a liquid-to-liquid heat exchanger which permits for a primary and a secondary cooling circuit, each of said primary and said secondary cooling circuits optionally containing different types of said coolant.

12. The RF calorimeter of claim 3,
wherein said controller self-calibrates said calorimeter using said low-frequency reference source and an RF switch, a position of said RF switch determines whether power from said low-frequency reference source or said RF source is applied to said load,
wherein said controller controls said low-frequency reference source, said RF switch, and said RF source having said unknown power.

13. A method for making a radio frequency (RF) power measurement using an RF calorimeter, comprising:
providing an RF calorimeter,
said RF calorimeter having a measurement accuracy with an uncertainty of less than about ±0.25%,
said RF calorimeter having a low-frequency reference source integrated into said calorimeter for a purpose of self-calibration;
wherein said RF calorimeter further comprising a controller, said controller self-calibrates said RF calorimeter on-demand immediately prior to measuring a power value of an RF source having an unknown power;
said RF calorimeter having a silicon oil as a coolant;
calibrating said RF calorimeter using said low-frequency reference source; and
measuring said power value of said RF source having said unknown power.

14. The method of claim 13, wherein said RF calorimeter is a high-power flow RF calorimeter capable of maintaining National Metrology Institute (NMI) traceable measurement accuracy at frequencies up to about 3 GHz and power levels up to about 3000 Watts.

15. The method of claim 13, wherein said RF calorimeter further comprises an RF input and a load, said load having a body and an internal resistor located inside of said body, said internal resistor being electrically connected to said RF input, said internal resistor being in thermal contact with a coolant;

said load having a very high thermal efficiency to maximize a transfer of an RF power that is applied to said internal resistor through said RF input into thermal energy in said coolant flowing through said load, wherein said internal resistor converts said RF power to thermal energy and transfers said thermal energy to said coolant in thermal communication with said internal resistor while said coolant is flowing through said load, thereby minimizing RF power lost by thermal transfer through said body and minimizing RF power lost by thermal transfer through said RF input, said RF power lost through said RF input either lost through a center conductor or an outer conductor of said RF input, thereby no RF power is lost by thermal transfer from the internal resistor through said body of said load to an environment surrounding said body of said load, wherein said RF calorimeter optionally has a silver plated quartz tube providing mechanical and electrical connection between said RF input and said load, wherein said RF power lost by thermal transfer through said body and through said RF input contributing to less than about ±0.018% of total system uncertainty.

16. The method of claim 15, wherein said RF calorimeter further comprises a temperature-controlled enclosure for the load, said temperature-controlled enclosure isolating said load from changes to an ambient environment of said calorimeter, thereby ensuring that a thermal gradient between a coolant at an inlet of said load and said ambient environment is kept constant to minimize any error associated with said thermal gradient.

17. The method of claim 15, wherein said load for converting said RF power to a thermal energy is comprised of one or more individual loads.

18. The method of claim 15, wherein said use of said silicon oil as said coolant permits for an application of DC power to said load without a risk of electro-chemical reactions between said coolant and said load; wherein said coolant is cooled using a liquid-to-liquid heat exchanger which permits for a primary and a secondary cooling circuit, each of said primary and said secondary cooling circuits optionally containing different types of said coolant.

19. The method of claim 15, wherein said controller self-calibrates said RF calorimeter using said low-frequency reference source and an RF switch, a position of said RF switch determines whether power from said low-frequency reference source or said RF source is applied to said load, wherein said controller controls said low-frequency reference source, said RF switch, and said RF source having said unknown power.

20. The method of claim 13, wherein said RF calorimeter further comprises an RF switch, which permits for electrically controlled switching between said low-frequency reference source and said RF source having said unknown power, said RF switch having an insertion loss between about −0.0025 dB and about −0.0275 dB and return loss between about −40 dB and about −68 dB over the frequency of operation, and said RF switch optionally comprises an impedance-matched vacuum relay.

21. The method of claim 13, wherein said controller uses machine learning to generate and update a model of said RF calorimeter based on continuously acquired sensor data obtained during power measurements, wherein said model is used to measure said power value of said RF source, thereby enhancing a predictive accuracy of said RF calorimeter for power measurements under varying conditions.

22. The method of claim 13, wherein said uncertainty of said RF power measurement of said RF calorimeter enables a calibration of an RF power measurement device under test to uncertainties of less than about ±0.5%, when said RF power measurement device under test is calibrated to said RF calorimeter.

23. The method of claim 13, wherein said measurement accuracy of said RF calorimeter enables an extension of a time between calibrations of an RF power measurement device under test having about ±1% uncertainty or higher when said RF power measurement device under test is calibrated to said RF calorimeter, since said measurement accuracy of said RF calorimeter results in an increase in a test accuracy ratio (TAR) between said RF power measurement device under test and said RF calorimeter.

24. The method of claim 13, wherein said low-frequency reference source being located inside a main enclosure of said calorimeter.

25. A radio frequency (RF) calorimeter comprising:

a low-frequency reference source integral to the RF calorimeter for a purpose of self-calibration, said RF calorimeter having a silicon oil as a coolant;

a controller having a processor and a memory;

said memory storing executable code when executed by the processor performs actions comprising:

calibrating said RF calorimeter using said low-frequency reference source on-demand immediately prior to measuring a power value of an RF source having an unknown power; and measuring said power value of said RF source having said unknown power;

said RF calorimeter having a measurement accuracy with an uncertainty of less than about ±0.25%.

26. The RF calorimeter of claim 25, wherein said calorimeter is a high-power flow calorimeter capable of maintaining National Metrology Institute (NMI) traceable measurement accuracy at frequencies up to about 3 GHz and power levels up to about 3000 Watts.

27. The RF calorimeter of claim 25, wherein said calorimeter further comprises an RF input and a load, said load having a body and an internal resistor located inside of said body, said internal resistor being electrically connected to said RF input, said internal resistor being in thermal contact with a coolant;

said load having a very high thermal efficiency to maximize a transfer of an RF power that is applied to said internal resistor through said RF input into thermal energy in said coolant flowing through said load, wherein said internal resistor converts said RF power to thermal energy and transfers said thermal energy to said coolant in thermal communication with said internal resistor while said coolant is flowing through said load, thereby minimizing RF power lost by thermal transfer through said body and minimizing RF power lost by thermal transfer through said RF input, said RF power lost through said RF input either lost through a center conductor or an outer conductor of said RF input, thereby no RF power is lost by thermal transfer from the internal resistor through said body of said load to an environment surrounding said body of said load, wherein said RF calorimeter optionally has a silver plated quartz tube providing mechanical and electrical connection between said RF input and said load, wherein said RF power lost by thermal transfer through said body and through said RF input contributing to less than about ±0.018% of total system uncertainty.

28. The RF calorimeter of claim 27, wherein said calorimeter further comprises a temperature-controlled enclosure for the load, said temperature-controlled enclosure isolating said load from changes to an ambient environment of said calorimeter, thereby ensuring that a thermal gradient between said coolant at an inlet of said load and said ambient environment is kept constant to minimize any error associated with said thermal gradient.

29. The RF calorimeter of claim 27, wherein said load for converting said RF power to a thermal energy is comprised of one or more individual loads.

30. The RF calorimeter of claim 27, wherein said use of said silicon oil as said coolant, which permits for an application of DC power to said load without a risk of electrochemical reactions between said coolant and said load; wherein said coolant is cooled using a liquid-to-liquid heat exchanger which permits for a primary and a secondary cooling circuit, each of said primary and said secondary cooling circuits optionally containing different types of said coolant.

31. The RF calorimeter of claim 27, wherein said controller self-calibrates said calorimeter using said low-frequency reference source and an RF switch, a position of said RF switch determines whether power from said low-frequency reference source or said RF source is applied to said load, wherein said controller controls said low-frequency reference source, said RF switch, and said RF source having said unknown power.

32. The RF calorimeter of claim 25, wherein said calorimeter further comprises an RF switch, which permits for electrically controlled switching between said low-frequency reference source and said RF source having said unknown power, said RF switch having an insertion loss between about −0.0025 dB and about −0.0275 dB and return loss between about −40 dB and about −68 dB over the frequency of operation, and said RF switch optionally comprises an impedance-matched vacuum relay.

33. The RF calorimeter of claim 25, wherein said controller uses machine learning to generate and update a model of said calorimeter based on continuously acquired sensor data obtained during power measurements, wherein said model is used to measure said power value of said RF source, thereby enhancing a predictive accuracy of said calorimeter for power measurements under varying conditions.

34. The RF calorimeter of claim 25, wherein said uncertainty of said power measurement of said calorimeter enables a calibration of an RF power measurement device under test to uncertainties of less than about ±0.5%, when said RF power measurement device is calibrated to said calorimeter.

35. The RF calorimeter of claim 25, wherein said measurement accuracy of said calorimeter enables an extension of a time between calibrations of an RF power measurement device under test having about ±1% uncertainty or higher when said RF power measurement device is calibrated to said calorimeter, since said measurement accuracy of said calorimeter results in an increase in a test accuracy ratio (TAR) between said RF power measurement device under test and said calorimeter.

36. The RF calorimeter of claim 25, wherein said low-frequency reference source being located inside a main enclosure of said calorimeter.

* * * * *